(12) United States Patent
Kawai et al.

(10) Patent No.: US 6,452,226 B2
(45) Date of Patent: Sep. 17, 2002

(54) NON-VOLATILE SEMICONDUCTOR MEMORY DEVICE AND MANUFACTURING METHOD THEREOF

(75) Inventors: Kenji Kawai; Hajime Kimura; Kazuyuki Ohmi, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/790,700

(22) Filed: Feb. 23, 2001

Related U.S. Application Data

(62) Division of application No. 09/286,421, filed on Apr. 6, 1999, now Pat. No. 6,228,712.

(30) Foreign Application Priority Data

Nov. 10, 1998 (JP) ............................................. 10-319415

(51) Int. Cl.[7] ................................................. H01L 29/72
(52) U.S. Cl. ...................... 257/315; 257/316; 257/324; 257/367; 257/340; 257/401
(58) Field of Search ................................. 257/315, 316, 257/324, 367, 340, 401

(56) References Cited

U.S. PATENT DOCUMENTS

| 5,342,801 A | | 8/1994 | Perry et al. |
| 5,430,313 A | * | 7/1995 | Kumagai et al. ............ 257/315 |
| 5,637,895 A | * | 6/1997 | Iwata et al. ................. 257/315 |
| 5,973,353 A | * | 10/1999 | Yang et al. .................. 257/315 |

FOREIGN PATENT DOCUMENTS

| JP | 8-148584 | 6/1996 |
| JP | 10-107163 | 4/1998 |

* cited by examiner

*Primary Examiner*—Edward Wojciechowicz
(74) *Attorney, Agent, or Firm*—McDermott, Will & Emery

(57) ABSTRACT

A non-volatile semiconductor memory device and a manufacturing method of the same where an etching residue generating short-circuit between gates is made harmless or a device is miniaturized are obtained. The method includes the steps of forming on a semiconductor substrate, a first gate layer and a second gate layer, forming a second gate electrode by etching the second gate layer, forming a first gate electrode by etching the first gate layer using the second gate electrode as a mask, and removing a residue left on a step portion by isotropic etching.

6 Claims, 27 Drawing Sheets

NON-VOLATILE SEMICONDUCTOR MEMORY DEVICE AND MANUFACTURING METHOD THEREOF

This application is a Divisional of application Ser. No. 09/286,421 filed Apr. 6, 1999.

BACKGROUND OF THE INVENTION

1. Field of the Invention

The present invention relates to non-volatile semiconductor memory devices employed in various computing devices, control equipment or the like, and a manufacturing method thereof 2. Description of the Background Art A non-volatile semiconductor memory device is used for writing/reading a piece of information, based on change in electric field effect to a channel portion caused by the electric charge in the floating gate, by applying a high voltage between a floating gate and a source or a drain, and injecting/pulling electric charge into/out from the floating gate. As the electric charge in the floating gate is isolated by an insulation film, it can be retained for a long time as non-volatile information even after the power-off.

A conventional non-volatile semiconductor memory device will be described with reference to FIG. 53.

On a floating gate fin electrode 509, a second gate insulation film 512 is formed and a control gate lower electrode 513 of polycrystalline silicon and a control gate upper electrode 514 of a metal silicide film are formed thereon. A control gate electrode 517 is formed of control gate lower electrode 513 and control gate upper electrode 514. Further on control gate upper electrode 514 of the metal silicide film, a hard mask 515 which selves as a mask at etching is formed of a silicon oxide film.

Bit lines are arranged among sources/drains from the back to the front and word lines. are arranged from the right to the left in the drawing.

In FIG. 53, control gate electrode 517 and second gate insulation film 512 in the front section are not shown to allow the viewer to see a central trench portion. A structure shown in FIG. 53 is formed by etching control gate electrode 517 and second gate insulation film 512 using hard mask 515 of a silicon oxide film as a mask, removing a floating gate layer through anisotropic etching using control gate electrode 517 as a mask, and thereby forming a floating gate electrode 518. Here, a polycrystalline silicon residue which is an etching residue 519 is left on a side wall of an insulation film facing the central trench portion.

Another example where etching residue remains is shown in FIGS. 54 and 55. An end portion itself of a floating gate electrode 618 serves as a mask at a step formed by an end of floating gate electrode 618 and an isolating insulation film 602, and a polycrystalline silicon residue 619 is produced on a side wall of the step formed by isolating insulation film 602 and the end of the floating gate electrode as shown in FIG. 55.

Generally, in a non-volatile semiconductor memory device such as a flash memory, capacitance coupling ratio $C_2/(C_1+C_2)$ must be high. Here, capacitance $C_1$ is capacitance between the floating gate electrode and a channel portion and capacitance $C_2$ is coupling capacitance between the control gate electrode and the floating gate electrode. When voltage V is applied from an external source to the control gate electrode, potential on the floating gate electrode is $C_2/(C_1+C_2)$. Therefore, in order to apply a sufficiently high voltage on the floating gate electrode, a correspondingly high capacitance coupling ratio is required. The high capacitance coupling ratio allows an operation of non-volatile semiconductor memory device at a low voltage while securing a high floating gate potential.

To increase the capacitance coupling ratio, capacitance $C_2$ between the control gate electrode and the floating gate electrode must be increased. Therefore, a fin electrode 509 is provided in an upper portion of the floating gate electrode thereby increasing the area between the floating gate electrode and the control gate electrode.

In the above described structure, some portions are undesirably masked from being etched at the anisotropic etching of floating gate electrode 518 of polycrystalline silicon or the like, and etching residue 519 tends to be produced along the side wall of the insulation film facing the trench portion. Such polycrystalline silicon residue forms short circuits between gate electrodes and as a result causes a significant yield reduction. In addition, even if etching selectivity between polycrystalline silicon and an underlying layer is made as high as possible to permit over-etching for the removal of the etching residue, there is a certain limitation in the etching selectivity and first gate insulation film 503 possibly be penetrated.

In addition, in non-volatile semiconductor memory devices such as a flash memory, for the increase in capacitance $C_2$ between the floating gate electrode and the control gate electrode which in turn increases the above mentioned capacitance coupling ratio, an area of the floating gate electrode, especially width thereof must be increased. Conventionally, the width of the floating gate electrode is increased by providing fin electrode 509 up to about three times the length of the channel portion. Therefore, the area of the floating gate electrodes is increased and hinders the miniaturization of non-volatile semiconductor memory devices.

SUMMARY OF THE INVENTION

An object of the present invention is to remove an etching residue or make the etching residue harmless without damaging a first gate insulation film and an interlayer insulation film. A further object of the present invention is to obtain a high capacitance coupling ratio without increasing an area of a floating gate electrode and to attain miniaturization of non-volatile semiconductor memory devices.

In one aspect of the present invention, a method of manufacturing includes the steps of: forming a first gate layer on a main surface of a semiconductor substrate with a first gate insulation film posed therebetween; forming a second gate layer on the first gate layer with a second gate insulation film posed therebetween; forming a second gate electrode by etching the second gate layer using a resist as a mask; forming a first gate electrode by etching the first gate layer using the second gate electrode as a mask; and performing an isotropic etching on an etching residue left on a side wall of a step formed by an insulation film in contact with a side wall of the first gate layer and the first gate insulation film, after the etching of the first gate layer, to remove the etching residue.

As the etching residue is removed by isotropic etching, short circuit between gate electrodes can be prevented and yield improvement can be achieved.

Preferably, a gas containing halogen element is employed in the above mentioned isotropic etching.

The etching residue can be removed without damages on the first gate insulation film and the interlayer insulation film through the use of gas containing halogen element, and yield improvement can be achieved.

In particular, the gas containing halogen element is preferably one of the following gases (1), (2) and (3).

(1) One selected from the group consisting of $Cl_2$ gas, a mixed gas of $Cl_2$ and $NF_3$, a mixed gas of $Cl_2$ and $O_2$, a mixed gas of Vapor HF and $O_2$, a mixed gas of $CF_4$ and $O_2$, a mixed gas of $CHF_3$ and $O_2$, a mixed gas of $SF_6$ and $O_2$, and a mixed gas of $NF_3$ and $O_2$.

(2) A gas prepared by using one of $N_2O$, $CO_2$, $O_3$, $H_2O_2$ and $H_2O$ instead of $O_2$ in the gas of (1).

(3) A mixed gas prepared by further adding at least one of He, Ne, Ar, Kr, Xe and $N_2$ to the gas of (1).

In addition, a gas prepared by adding at least one of He, Ne, Ar, Kr, Xe and $N_2$ to the gas of (2) can be employed.

With the use of these gases, the etching residue can be efficiently removed without damages on the first gate insulation film and the interlayer insulation film. As a result, short circuit between gates can be prevented and yield improvement is allowed.

When formation of a non-uniformly etched side wall of the second gate electrode is not desired at the above mentioned isotropic etching, a step of forming a protective film on the side wall of the second gate electrode desirably is further included prior to the step of performing the isotropic etching.

By the formation of the protective film, the non-uniformity in etching of the second gate electrode can be prevented especially when it is formed of a metal silicide layer. Therefore, the etching residue causing short circuit between gate electrodes can be removed while variations in dimension and interconnection resistance are suppressed. In addition, with no damages on the first gate insulation film and the interlayer insulation film, yield improvement is allowed.

In accordance with the one aspect of the present invention, in order to prevent the non-uniformity in oxidation of the side surfaces of the gate electrodes caused at the isotropic etching, the manufacturing method desirably further includes a step of performing a wet process on the etching residue with a chemical containing at least 1% of $H_2O_2$ prior to the step of performing the isotropic etching, to make uniform the thicknesses of oxide films on the side walls of the gate electrode after the isotropic etching.

By the wet process with the chemical containing at least 1% of $H_2O_2$, the thicknesses of the oxide films on the side walls of the first and second gate electrodes become uniform and the removal of etching residue is allowed without causing variations in dimension and interconnection resistance. In addition, with no damages on the first gate insulation film and the interlayer insulation film, yield improvement can be achieved.

In accordance with a further aspect of the present invention, when removal of etching residue by the wet process is important, the method of manufacturing includes the steps of: forming a first gate lower layer on a main surface of a semiconductor substrate with a first gate insulation film posed therebetween; forming sidewall spacers of an insulation film on side walls of the first gate lower layer and an insulation film formed thereon; forming an interlayer insulation film in contact with the sidewall spacer, from an insulation film of a material different from the sidewall spacer; forming a second gate layer on a first gate layer with a second gate insulation film posed therebetween; forming a second gate electrode by etching the second gate layer using a resist as a mask; forming a first gate electrode by etching the first gate layer using the second gate electrode as a mask; and performing a wet process on the sidewall spacer after the formation of the first gate electrode through etching of the first gate layer, removing the sidewall spacer, and removing by lift-off an etching residue left on a side wall of a step formed by the sidewall spacer and the first gate insulation film.

By the wet process involving the lift-off, the etching residue can be securely removed together with the sidewall spacer, whereby short circuit can be prevented from being caused by the etching residue with high reliability. As a result, a significant yield improvement can be achieved.

When the etching residue is lift off by the removal of sidewall spacer as described above, if protection of a side wall of second gate electrode is important, a step of forming a sidewall of an insulation film on the side wall of the second gate electrode is desirably further included after the step of forming the second gate electrode and prior to the step of forming the first gate electrode.

By providing a protective film on the side wall of the second gate electrode as described above, short circuit between gate electrodes as well as the damages on the second gate electrode can be prevented and yield improvement can be achieved.

In accordance with a still further aspect of the present invention, when it is important to taper the central trench portion to make width thereof wider towards the top of the trench at the anisotropic etching for the formation of the first gate electrode, the method of manufacturing includes the steps of: forming a photo resist or an insulation film on a main surface of a semiconductor substrate at a position where a gate electrode is to be formed; forming an active region by implanting an impurity into the semiconductor substrate using the photo resist or the insulation film as a mask; forming an interlayer insulation film on the semiconductor substrate; etching the interlayer insulation film, forming a trench in a position where the gate electrode is to be formed, and tapering opposing sides of the trench to widen the width towards the top of the trench, in a section perpendicular to a direction of extension of the trench; and forming a first gate electrode along the trench.

With the above described tapered trench portion having a wider width towards the top, a portion of the first gate electrode layer to be etched become easily accessible. As a result, the etching residue is not left on the side surface of the trench, and short circuit between gate electrodes is prevented. In addition as no damages are caused in other portions, yield improvement is allowed.

In accordance with a still further aspect of the present invention, when it is important to form a tapered trench wider towards the top by forming a tapered silicon nitride film having an upper surface wider than a bottom surface, the method of manufacturing includes the steps of: depositing a silicon nitride film on a main surface of a semiconductor substrate; selectively etching the silicon nitride film so as to be left in a position where a gate electrode is to be formed with a resist as a mask and tapering each of opposing sides of the silicon nitride film so as to widen the width of the silicon nitride film upwards, in the section perpendicular to extension of the side wall of the silicon nitride film; forming an active region by implanting an impurity into the semiconductor substrate using the silicon nitride film as a mask; forming an interlayer insulation film on the semiconductor substrate; removing the silicon nitride film, forming a trench with each of opposing sides of the trench being tapered in the section to widen the width of the trench upwards; and forming a first gate electrode along the trench.

When the first gate electrode is formed along the tapered trench with widened width towards the top, no portion is blocked from etching. As a result, no etching residue is produced and short circuit is not generated whereby yield improvement is allowed.

In accordance with the one aspect of the present invention, when prevention of short circuit between gate electrodes is important along with the protection of the side wall of the second gate region, a non-volatile semiconductor memory device includes: a first gate insulation film formed on a main surface of a semiconductor substrate; a first gate electrode formed thereon; a second gate electrode formed on the first gate electrode with a second gate insulation film posed therebetween; and a protective film on a side wall of the second gate electrode.

By providing a protective film on the side wall of the second gate electrode, side etching does not occur on the side wall of the second gate electrode at the formation of the first gate electrode through the etching of the first gate layer. As a result, a non-volatile semiconductor memory device preventing short circuit between gate electrodes without causing variations in dimension of the side wall of the second gate electrode and the interconnection resistance can be provided.

In accordance with the further aspect of the present invention, a non-volatile semiconductor memory device includes; a first gate insulation film formed on a main surface of a semiconductor substrate; a first gate electrode formed thereon; a second gate electrode formed on the first gate electrode with a second gate insulation film posed therebetween; and silicon compound formed by turning a polycrystalline silicon into an insulation on a step side wall formed by an insulation film in contact with a side wall of the first gate electrode and the first gate insulation film.

By turning the etching residue formed on the step side wall into an insulation, short circuit between gate electrodes can be prevented from being caused by the etching residue. As a result, yield improvement and an inexpensive device can be provided. Here, thermal oxidation, nitriding or ion implantation can be employed as a process for turning the etching residue into an insulation.

In accordance with the still further aspect of the present invention, when it is important not to produce etching residue from the time of anisotropic etching, a non-volatile semiconductor memory device includes: a first gate electrode formed by etching a first gate layer on a semiconductor substrate with a first gate insulation film posed therebetween; and a second gate electrode formed by etching a second gate layer on the first gate electrode with a second gate insulation film posed therebetween; an angle formed by an insulation film in contact with a side wall of the first gate electrode and the first gate insulation film being more than 90° with respect to the first gate electrode in a section perpendicular to extension of the side wall of the first gate electrode, and each of opposing side walls of the insulation film in contact with the side wall of the first gate electrode being tapered so as to widen the width of the first gate electrode upwards.

By setting the angle formed by the insulation film in contact with the side wall of the first gate electrode and the first gate insulation film larger than 90° with respect to the first gate electrode in a section perpendicular to the extension of the side wall of the first gate electrode, no portion is blocked from the etching at the anisotropic etching for forming the first gate electrode. As a result, etching residue is not produced and short circuit between gate electrodes can be prevented.

In accordance with the still further aspect of the present invention, when it is important that the device is miniaturized, a non-volatile semiconductor memory device includes: a first gate lower electrode formed on a main surface of a semiconductor substrate with a first gate insulation film posed therebetween; a first interlayer insulation film thicker than the first gate lower electrode and defining width of the first gate lower electrode; a second interlayer insulation film formed on the first interlayer insulation film; a first gate fin electrode formed on the first gate lower electrode, having a fin portion extending in the periphery of the first interlayer insulation film and along a side wall of the second interlayer insulation film, and making up a first gate electrode together with the first gate lower electrode; and a second gate electrode formed on the first gate fin electrode with a second gate insulation film posed therebetween.

As described above, by forming the fin portion as the first gate fin electrode extending in the periphery of the first interlayer insulation film and along the side wall of the second interlayer insulation film, a substantial area between the first gate electrode and the second gate electrode can be increased without increase in the plane area. As a result, a miniaturized non-volatile semiconductor memory device having a high coupling capacitance ratio can be provided at an inexpensive cost, and an operation at a low voltage of the device is allowed.

In addition, in the non-volatile semiconductor memory device in accordance with the further aspect of the present invention, a protective film is desirably provided on a side wall of the second gate electrode.

By providing the protective film on the side wall of the second gate electrode, even in the non-volatile semiconductor memory device described above having the fin portion along the side wall of the second interlayer insulation film, etching residue can be removed by isotropic etching without damaging the second gate electrode.

In addition, in accordance with the still further aspect of the present invention, the non-volatile semiconductor memory device further includes silicon compound formed by turning polycrystalline silicon into an insulation on a side wall of one of a step formed by an insulation film in contact with a side wall of the first gate lower electrode and the first gate insulation film, and a step formed by the first interlayer insulation film and the second interlayer insulation film.

By providing a compound formed by turning the etching residue into an insulation on the side wall of the above mentioned step, short circuit between gate electrodes can be prevented. When thermal oxidation, nitriding, or ion implantation is performed to turn the residue into an insulation, the second gate electrode may be damaged. Therefore, a protective film is desirably formed on the side wall of the second gate electrode in the non-volatile semiconductor memory device having a silicon compound as an insulation.

In the non-volatile semiconductor memory device achieving a high capacitance coupling ratio as described above, desirably an angle formed by the side wall of the insulation film in contact with the side wall of the first gate lower electrode and the first gate insulation film is more than 90° with respect to the first gate lower electrode in a section perpendicular to extension of the first gate lower electrode, and each of opposing side walls of the insulation film in contact with opposing side walls of the first gate lower electrode is tapered so as to widen the width of the first gate lower electrode upwards.

As described above, by tapering the side wall of the insulation film such that the opening formed by the first gate lower electrode becomes wider towards the top, no portion is blocked from etching, whereby etching residue is not produced.

In the non-volatile semiconductor memory device achieving a high capacitance coupling ratio as described above, further desirably, an angle formed by an upper surface of the first interlayer insulation film and the side wall of the second interlayer insulation film is more than 90° with respect to the upper surface of the first interlayer insulation film in contact with the fin portion, and each of opposing side walls of the second interlayer insulation film is tapered so as to widen the widths of the first gate fin electrode and the second gate electrode upwards.

By providing the tapered side wall of the second interlayer insulation film such that the widths of the first gate fin electrode and the second gate electrode become wider towards the top, also at the step formed by the upper surface of the first interlayer insulation film and the second interlayer insulation film, no portion is blocked from etching. As a result, the tapered side wall of the second interlayer insulation film as well as the tapered side wall of the insulation film at the step formed by the insulation film in contact with the side wall of the first gate lower electrode and the first gate insulation film, allow the removal of etching residue at both step portion, and even more secure prevention of short circuit between gate electrodes is allowed.

In the non-volatile semiconductor memory device achieving a high capacitance coupling ratio as described above, when decreases in area and cost are important, at least a surface of the fin portion in the first gate fin electrode is desirably roughened. The roughening treatment is also desirable when (a) silicon compound turned into an insulation is included, (b) the first gate lower electrode is tapered such that it becomes wider towards the top, or (c) in addition to the first gate lower electrode, the second gate electrode is also tapered such that it becomes wider towards the top.

By roughening at least the surface of the fin portion in the non-volatile semiconductor memory device, a substantial area between the first gate electrode and the second gate electrode is increased. As a result, a miniaturized and inexpensive non-volatile semiconductor memory device having a high coupling capacitance ratio can be provided. In addition, an operation at a still lower voltage is allowed for the above described device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 26 is a perspective view of a structure where the etching residue has been subjected to thermal oxidation or the like.

FIG. 31 is a perspective view of a structure where the etching residue has been subjected to thermal oxidation or the like.

DESCRIPTION OF THE PREFERRED EMBODIMENTS

Preferred embodiments of the present invention will be described with reference to the drawings.

First Embodiment

Figure 1:
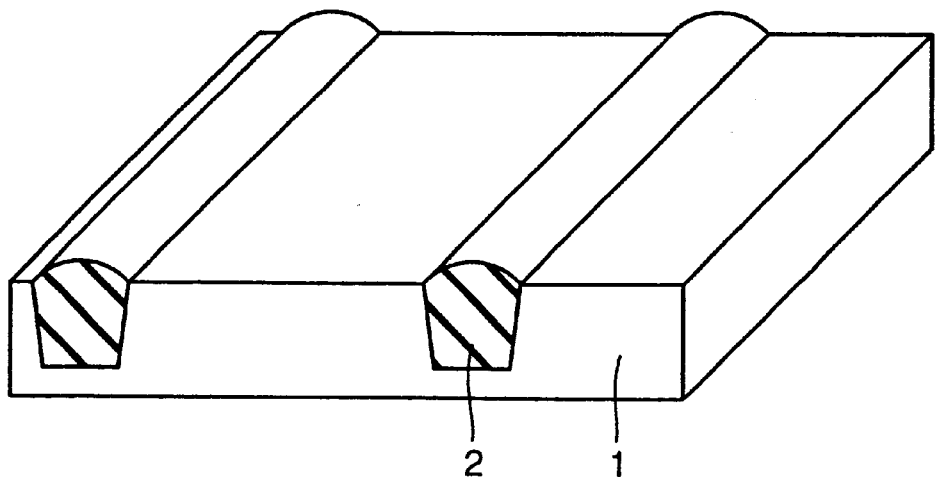
FIG. 1 is a perspective view of a structure with an insolation film in a semiconductor substrate.
Figure 2:
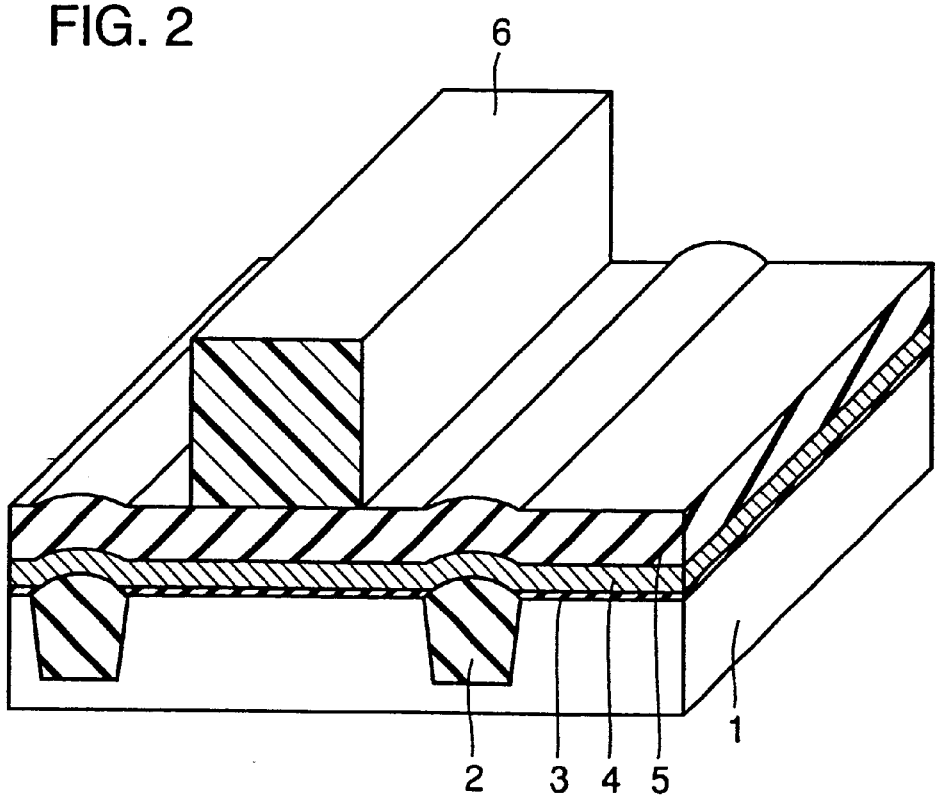
FIG. 2 is a perspective view of a structure with a resist formed on a floating gate (hereinafter referred to as FG) film.

With reference to FIG. 1, first in a surface of a silicon substrate 1, a trench isolation film 2 is formed. Then on a main surface of silicon substrate 1, a silicon oxide film which is to be a first gate isolation film 3, a polycrystalline silicon film which is to be a floating gate lower layer 4, a silicon nitride film which is used as a hard mask 5 are formed from the bottom in this order. Then as shown in FIG. 2, a resist pattern 6 is formed in a predetermined region by a normal photolithography.

Figure 3:
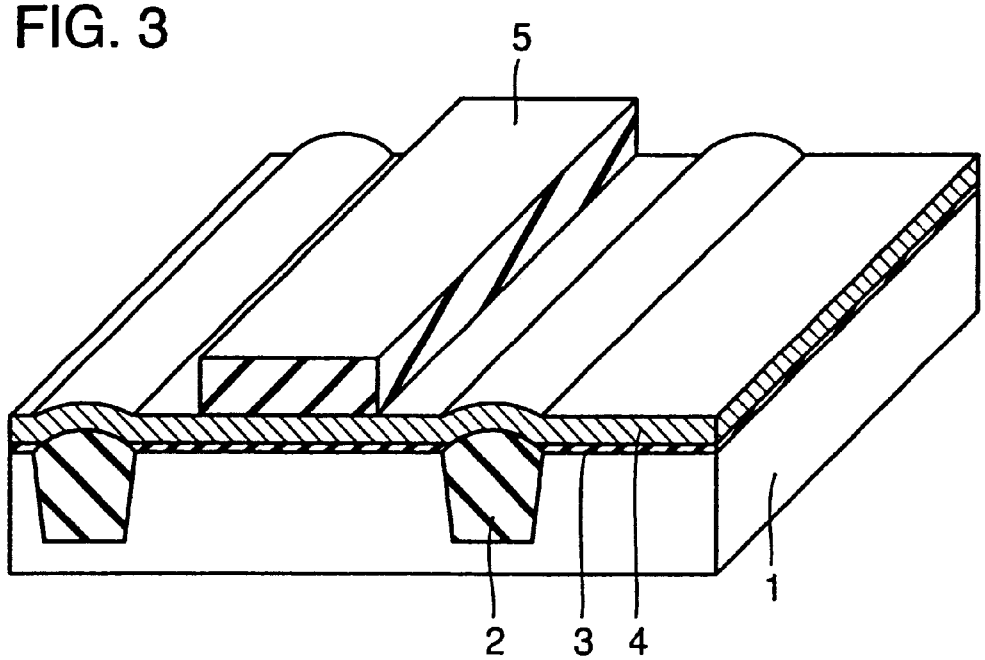
FIG. 3 is a perspective view of a structure with a patterned hard mask.

As shown in FIG. 3, silicon nitride film 5 is etched using resist pattern 6 as a mask and then resist pattern 6 is removed.

Figure 4:
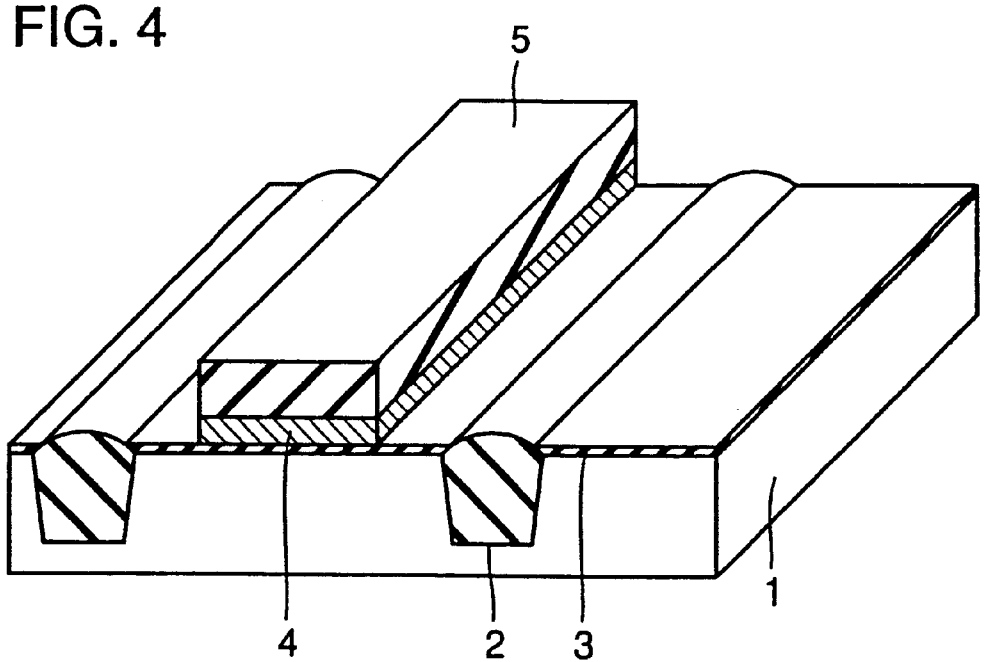
FIG. 4 is a perspective view of a structure with a patterned FG.

Using silicon nitride film 5 formed by the above mentioned etching as a mask, a polycrystalline silicon film 4 is patterned as shown in FIG. 4.

Figure 5:
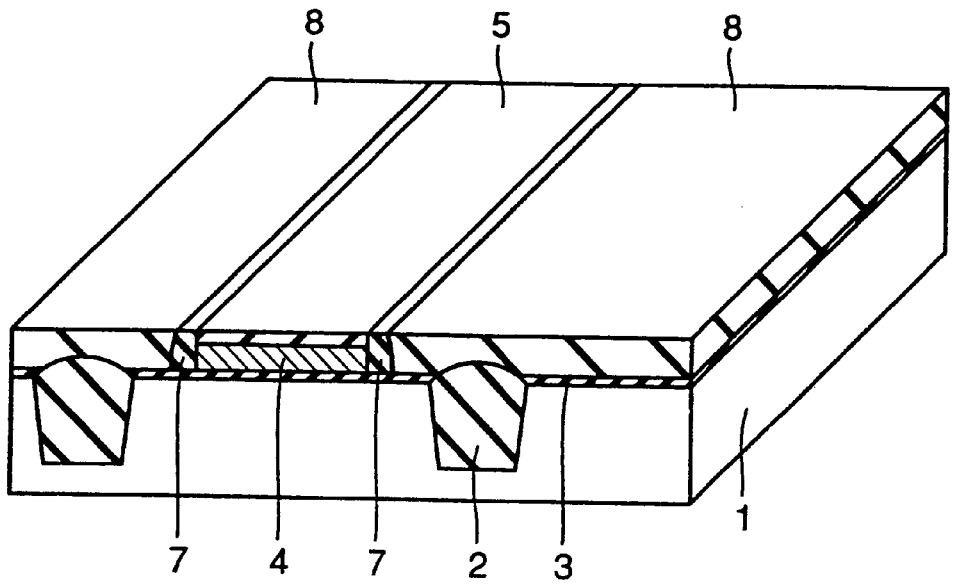
FIG. 5 is a perspective view of a structure where a sidewall spacer for the FG and an interlayer insulation film are formed and subjected to CMP (Chemical Mechanical Polishing).

After the formation of sidewall spacers 7 of a silicon oxide film on side walls of above mentioned patterned polycrystalline silicon film 4 and the silicon nitride film, an interlayer insulation film 8 is formed from a silicon oxide film. Chemical Mechanical Polishing (CMP) is subsequently performed to etch back and planarize interlayer insulation film 8 until silicon nitride film 5 is exposed as shown in FIG. 5.

Figure 6:
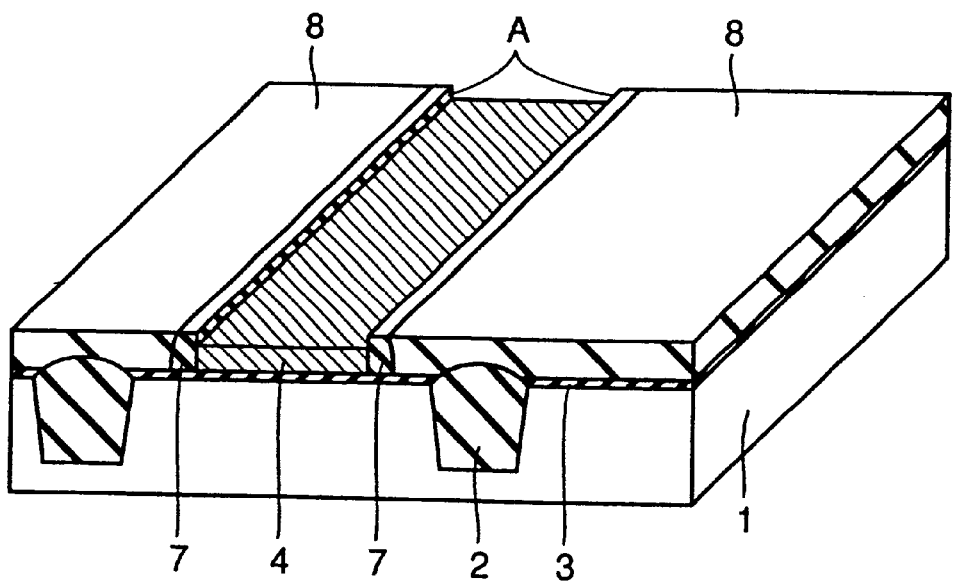
FIG. 6 is a perspective view of a structure where the hard mask has been removed.

Then, by the wet process with hot phosphoric acid or the like, silicon nitride film 5 is removed and polycrystalline silicon film 4 is exposed as shown in FIG. 6. As indicated by a character A in FIG. 6, a vertical step is formed between sidewall spacer 7 and floating gate lower electrode 4.

Figure 7:
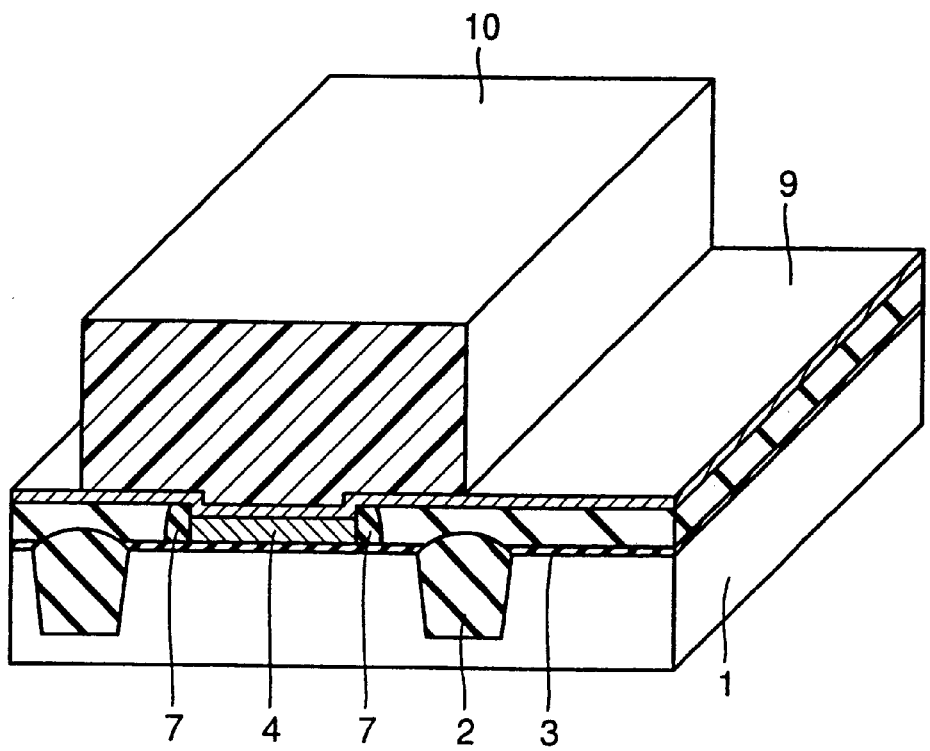
FIG. 7 is a perspective view of a structure where a fin layer of the FG is deposited and a resist is formed thereon.

Then, a polycrystalline silicon film which is to be a floating gate fin layer 9 is formed and a resist pattern 10 is formed thereon in a predetermined region by a normal photolithography as shown in FIG. 7.

Figure 8:
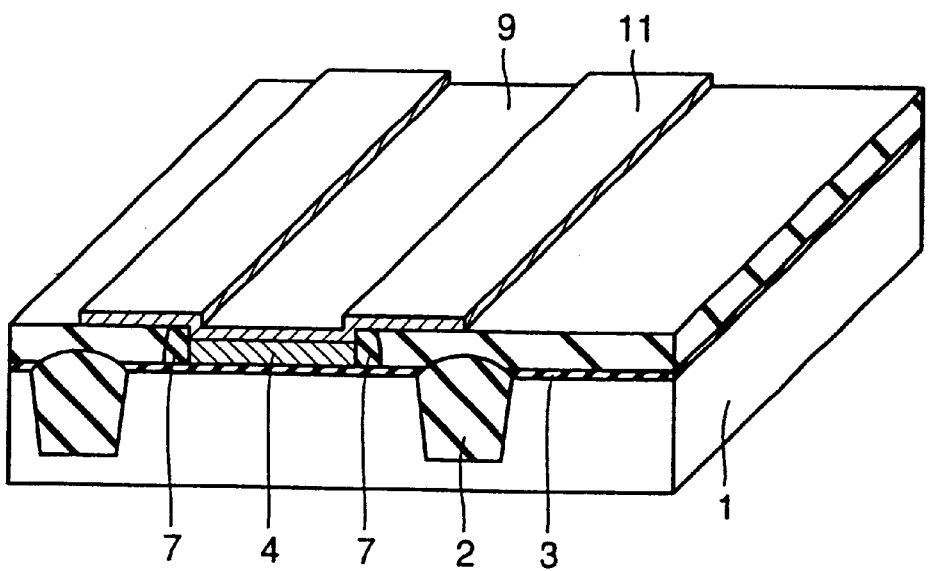
FIG. 8 is a perspective view of a structure where a fin portion of the FG is patterned.

After a fin portion 11 which is a part of the floating gate fin layer is formed through the etching using resist pattern 10 as a mask, resist pattern 10 is removed as shown in FIG. 8.

Figure 9:
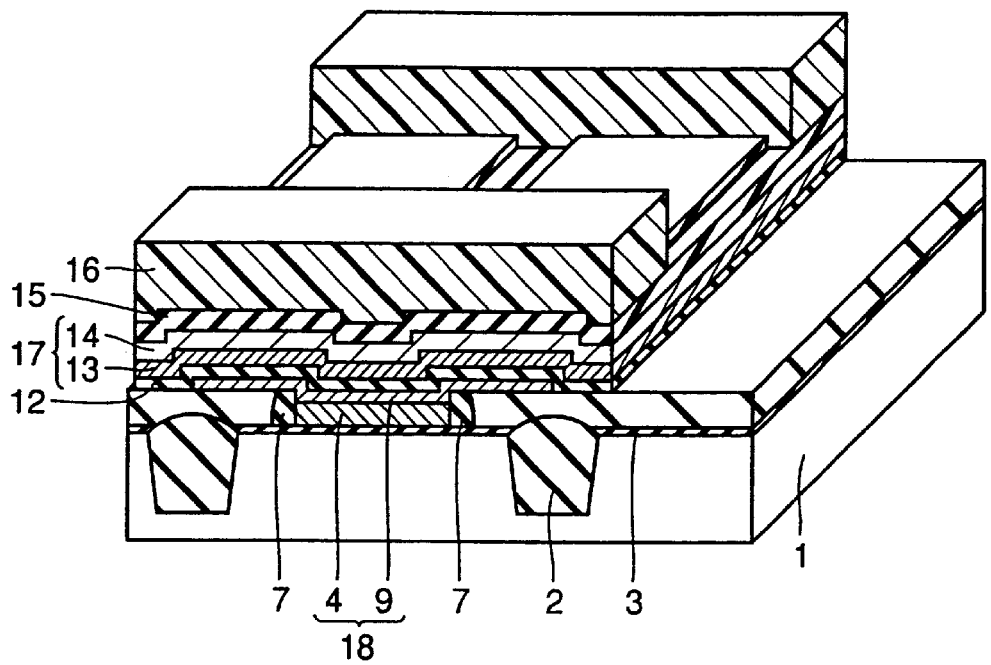
FIG. 9 is a perspective view of a structure where a resist is formed after the deposition of a second gate insulation film, a control gate (hereinafter referred to as CG), and a hard mask.

Then, on above described floating gate fin layer 9, a second gate insulation film 12 of an ONO (Oxide Nitride Oxide) film having a configuration consisting of an oxide film/a nitride film/an oxide film, a control gate lower layer 13 of a polycrystalline silicon film, a control gate upper layer 14 of a metal silicide film, a hard mask 15 of a silicon oxide film are formed in this order from the bottom, and a resist pattern 16 is formed in a predetermined region by a normal photolithography as shown in FIG. 9.

Figure 10:
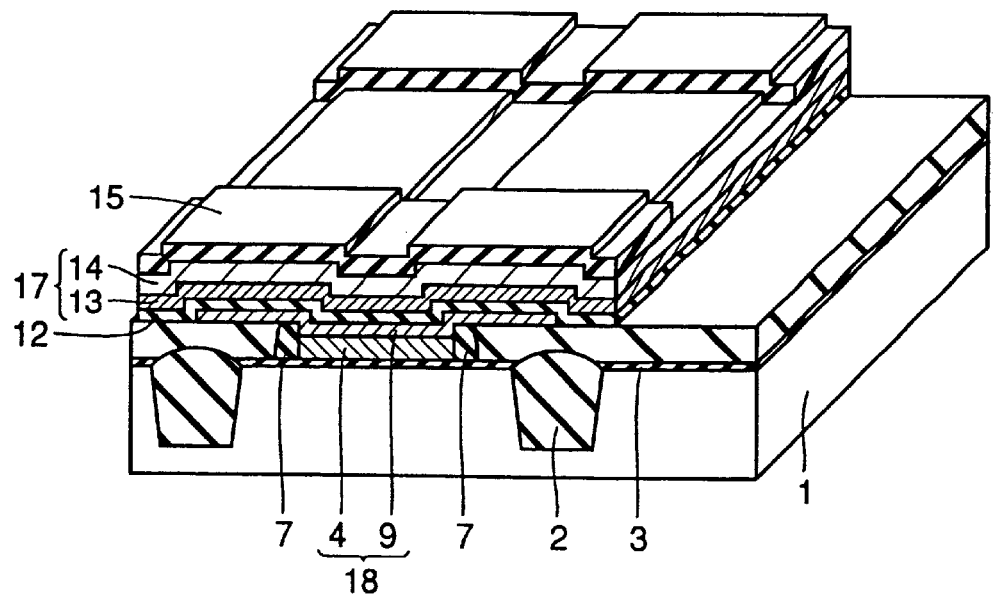
FIG. 10 is a perspective view of a structure where a hard mask is patterned with the use of the resist.

Then, using resist pattern 16 as a mask, hard mask 15 is etched and resist pattern 16 is removed as shown in FIG. 10.

Figure 11:
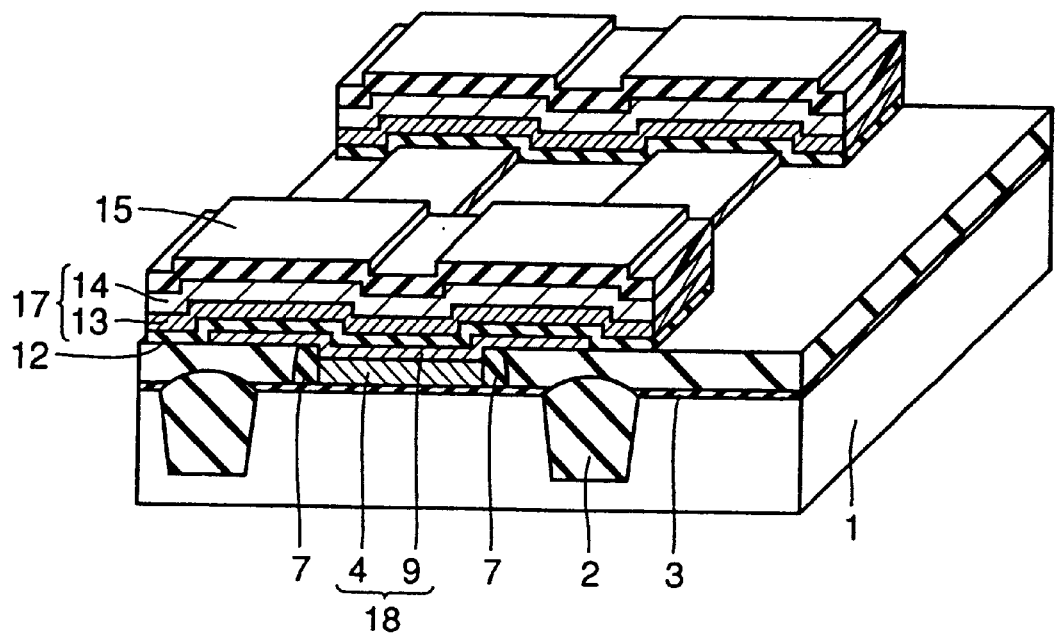
FIG. 11 is a perspective view of a structure patterned down to the second gate insulation film using the hard mask.
Figure 12:
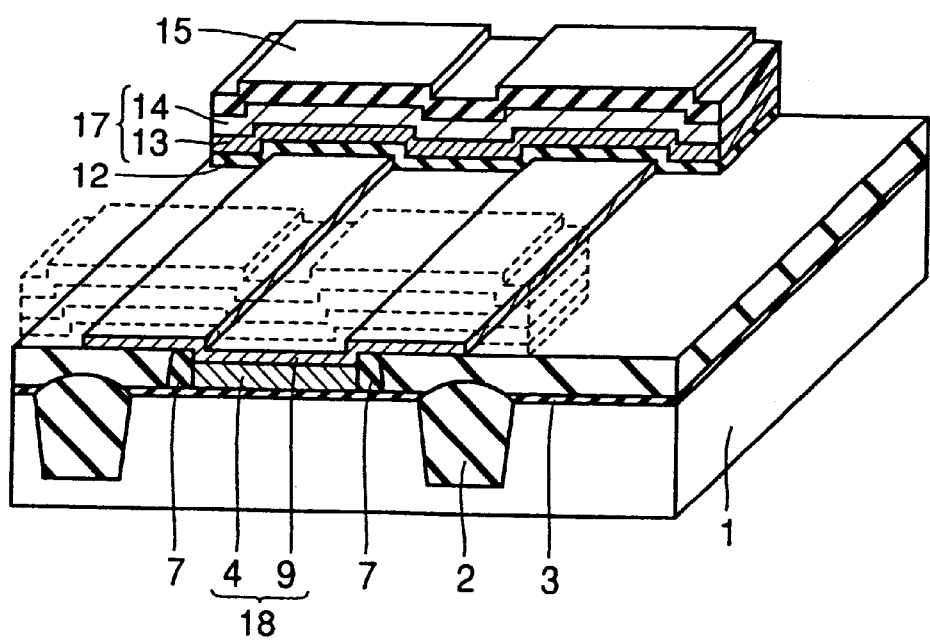
FIG. 12 is a perspective view where elements such as the CG in the front section shown in FIG. 11 are not shown.

Then, the control gate layer and second gate insulation film 12 are etched using hard mask 15 as a mask, and a control gate electrode 17 is formed as shown in FIG. 11. In FIG. 12, the control gate electrode, the second gate insulation film and the hard mask in the front section shown in FIG. 11 are not shown to allow the viewer to see the trench portion.

Next, a floating gate electrode 18 is formed by etching the floating gate layer using the control gate electrode as a mask. At this time, an etching residue of polycrystalline silicon is produced along side walls of the central trench portion formed by the etching.

Figure 13:
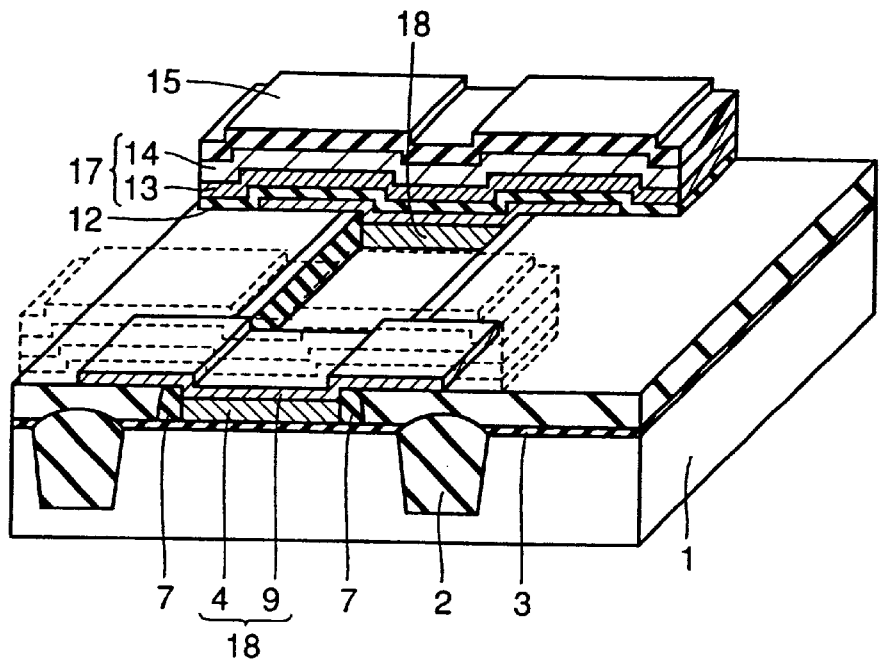
FIG. 13 is a perspective view of a structure where an etching residue has been removed by isotropic etching after the FG region was etched with the use of the CG or the like as a mask.

The etching residue is then removed as shown in FIG. 13 through isotropic etching capable of etching 500 Å thick polycrystalline silicon film by a down flow type etching system or the like.

One of the following gases is used in the down flow type etching system.

(1) One selected from the group consisting of $Cl_2$, a mixed gas of $Cl_2$ and $NF_3$, a mixed gas of $Cl_2$ and $O_2$, a mixed gas of Vapor HF and $O_2$, a mixed gas of $CF_4$ and $O_2$, a mixed gas of $CHF_3$ and $O_2$, a mixed gas of $SF_6$ and $O_2$, and a mixed gas of $NF_3$ and $O_2$.

(2) The gas in the group (1) containing $N_2O$, $CO_2$, $O_3$, $H_2O_2$, or $H_2O$ instead of $O_2$.

(3) Gas prepared by adding at least one of He, Ne, Ar, Kr, Xe and $N_2$ to the gas in the groups (1) and (2).

Figure 14:
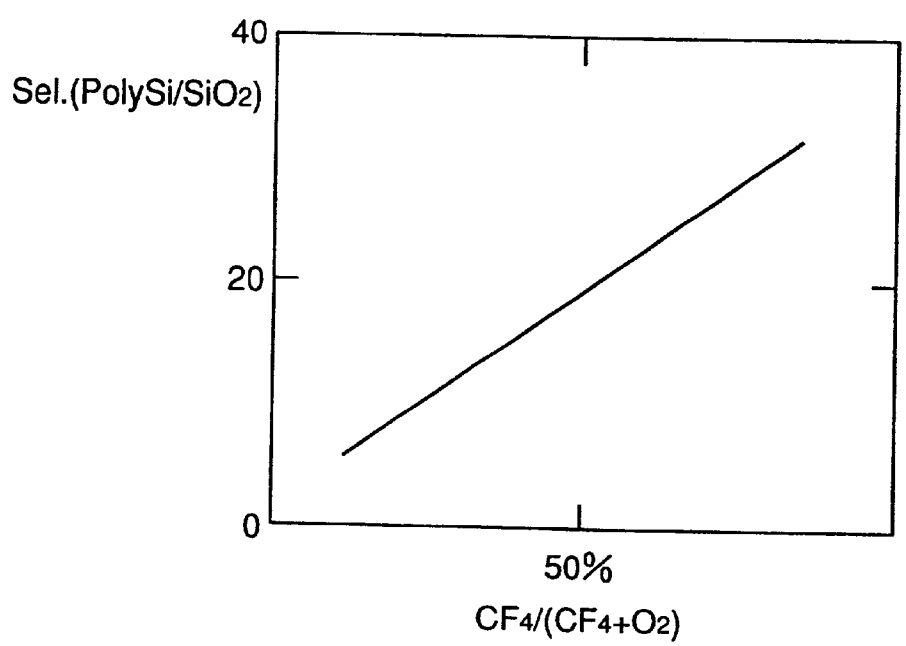
FIG. 14 is a graph showing the dependence of selectivity on $CF_4$ content in a gas.

FIG. 14 is a graph showing dependence of the etching selectivity of polycrystalline silicon to $SiO_2$ on the concentration of $CF_4$ in etching gas $CF_4/O_2$ ($CF_4/(CF_4+O_2)$). At the isotropic etching, the selectivity of polycrystalline silicon to $SiO_2$ must be more than 15 for the prevention of the etching of first gate insulation film 3 and interlayer insulation film 8. For this purpose, the concentration of $CF_4$ is desirably equal to or more than 40% as can be seen from FIG. 14.

Thus, by the manufacturing method including the step of performing the isotropic etching after the formation of the floating gate electrode, the removal of polycrystalline silicon residue produced on the side wall of trench portion of the insulation film and the prevention of short circuit are allowed. In addition, by the control of composition of gas used in the isotropic etching, the etching residue can be removed without damaging the underlying first gate insulation film and the interlayer insulation film, allowing a significant yield improvement for the non-volatile semiconductor memory devices.

Second Embodiment

Figure 15:
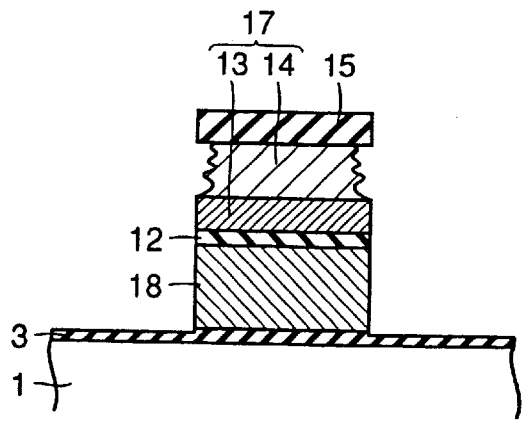
FIG. 15 is a sectional view by a plane perpendicular to an extension of word line in a gate region.

In the practice of the above described first embodiment, the following problems may occur depending on the etching conditions. When the floating gate layer is etched back using control gate electrode 17 as a mask, and the polycrystalline silicon residue formed by the etching is removed by isotropic etching, though the polycrystalline silicon residue can be removed, a side wall portion of the control gate electrode, especially a side wall portion of layer 14 such as metal silicide is non-uniformly etched as shown in FIG. 15. FIG. 15 is a sectional view of a gate portion by a plane perpendicular to the extension of word line.

The side etched portion is produced by the non-uniform oxidation by $O_2$ contained in etching gas during the step of forming floating gate electrode 18 by etching the floating gate layer with plasma containing $Cl_2$ and $O_2$ using control gate electrode 17 as a mask. The non-uniform side etching results in variations in dimension and interconnection resistance. In the second embodiment, an oxide film, which is a protective film, is formed on the side wall portion of the control gate electrode to prevent the side etching.

Figure 16:
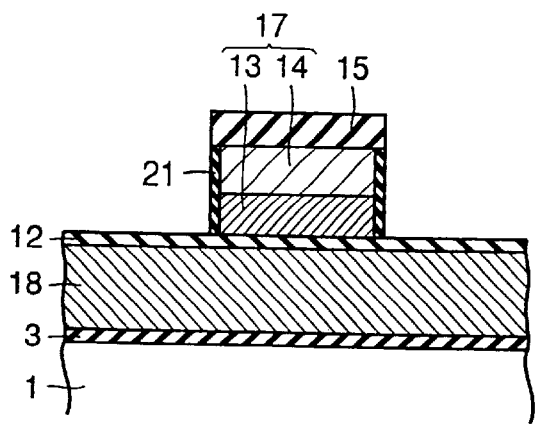
FIG. 16 is a sectional view of a structure with a protective film formed on a side wall of the CG.

The initial steps of the second embodiment are the same with the steps in the first embodiment shown in FIGS. 1–12. For the prevention of the variations described above, after the completion of the structure shown in FIG. 12 and after the formation of the control gate electrode, a side wall 21 of the control gate electrode of an oxide film of about 50 Å thick is formed on the side wall of control gate electrode as shown in FIG. 16, through ramp oxidation or thermal oxidation with the use of $O_2$ or a mixed gas of $O_2$ containing rare gas and $N_2$. Though in the case of a 0.25 μm-wide control gate, the interconnection width varies about 4% because of the oxidation, change in resistance does not matter. In addition, as second gate insulation film 12 such as an ONO film serves as a protective film for the polycrystalline silicon in the underlying floating gate fin layer, polycrystalline silicon will not be oxidized.

Figure 17:
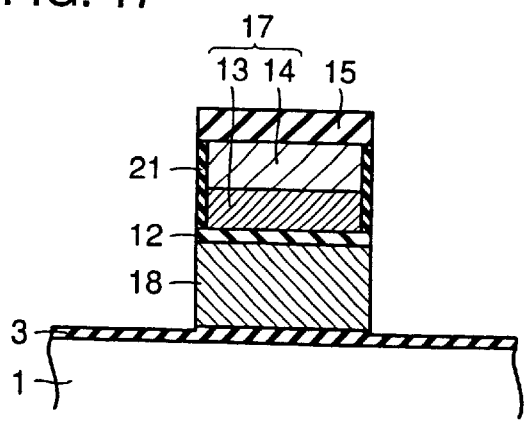
FIG. 17 is a sectional view of a structure where the FG is etched.

Then, as shown in FIG. 17, the floating gate electrode is formed through anisotropic etching of the floating gate layer with plasma containing $Cl_2$ gas, using the control gate electrode with control gate electrode side wall 21 as a mask. Even if isotropic etching as described in the first embodiment is subsequently performed, as control gate electrode side wall 21 serves as a protective film, side etching of a layer 14 of tungsten silicide or the like can be prevented. When the etching selectivity of polycrystalline silicon to $SiO_2$ is low at the isotropic etching, preferably the thickness of control gate electrode side wall 21 described above is made equal to or larger than that of underlying first gate oxide film 3.

Third Embodiment

In the third embodiment, a manufacturing method including a formation process of a protective film different from control gate electrode side wall 21 in the second embodiment will be performed. The initial steps of the manufacturing method are the same with the steps in the first embodiment shown in FIGS. 1–10. In the third embodiment, after the completion of the structure shown in FIG. 10, the control gate layer is etched down to just above second gate insulation film 12, using hard mask 15 of TEOS (Tetra-Ethyl Ortho-Silicate) oxide film as a mask. (In the second embodiment, second gate insulation film 12 is also etched as shown in FIGS. 11 and 12.)

Figure 18:
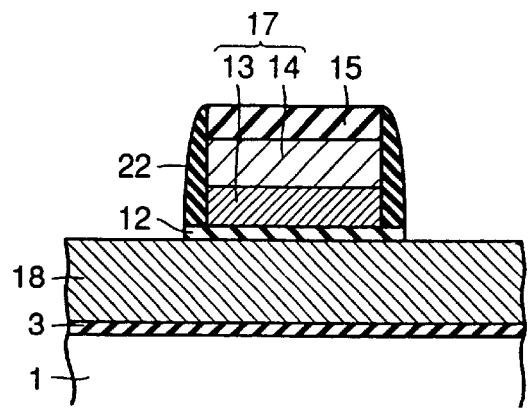
FIG. 18 is a sectional view of a structure with a sidewall formed on the side wall of the CG.
Figure 19:
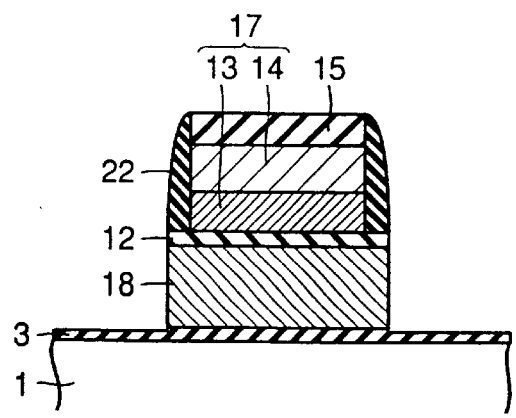
FIG. 19 is a sectional view of a structure where the FG is etched.

Then, a silicon oxide film such as a TEOS oxide film is deposited on side walls of control gate electrode 17 and hard mask 15 by CVD (Chemical Vapor Deposition). Through the etch back of the oxide film and ONO film 12 down to floating gate electrode 18 as shown in FIG. 18, a sidewall 22, which is a protective film for the side surface of control gate electrode 17 is formed. Then the floating gate layer is etched using sidewall 22 as a mask, and floating gate electrode 18 is formed as shown in FIG. 19. Sidewall 22 serves as a protective film at the subsequent isotropic etching in the same manner as control gate electrode side wall 21 in the second embodiment, thereby allowing the yield improvement in the non-volatile semiconductor memory devices.

Fourth Embodiment

Figure 20:
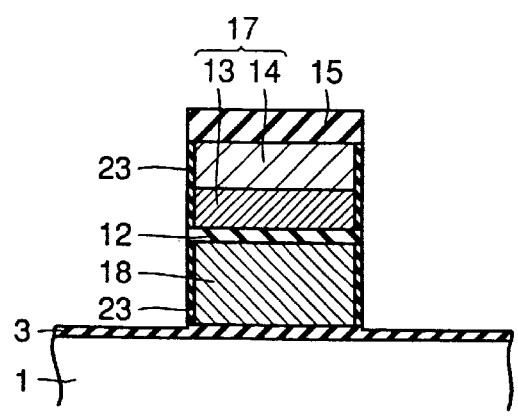
FIG. 20 is a sectional view of a structure with a protective film formed on the CG and the FG.

The variations in dimension and interconnection resistance can be suppressed by making uniform the side etching of control gate upper electrode 14 of tungsten silicide or the like as well as by preventing the side etching. The side wall portions of control gate electrode 17 and floating gate electrode 18, formed through the anisotropic etching of the structure shown in FIG. 10 using hard mask 15 of TEOS oxide film or the like as a mask and using $Cl_2$ and $O_2$, are oxidized in a non-uniform manner. As the thickness of the non-uniform portion is about 5 Å, the thickness of the oxide film after the subsequent isotropic etching can be made uniform as shown in FIG. 20 by performing oxidation with a chemical containing hydrogen peroxide $H_2O_2$ after the formations of the control gate electrode and the floating gate electrode. An oxide film of about 5 Å thickness can be sufficiently formed if the concentration of $H_2O_2$ is at least about 1%. The oxide film can be easily formed at low cost using a liquid mixture of $H_2SO_4$, $H_2O_2$ and $H_2O$ or a liquid mixture of $NH_4OH$, $H_2O_2$ and $H_2O$ generally used in the cleaning process, by changing the concentration of $H_2O_2$ therein to 1% or higher.

By making the oxide film thickness uniform through $H_2O_2$ treatment as described above, the non-uniform etching can be prevented thereby allowing the prevention of the variations in dimension and interconnection resistance.

Fifth Embodiment

Figure 21:
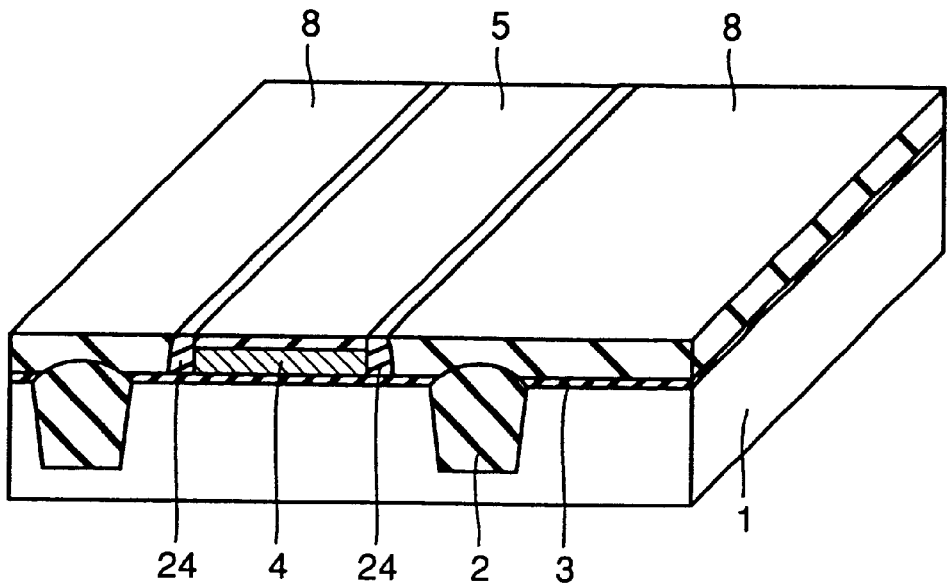
FIG. 21 is a perspective view of a structure where a sidewall spacer is formed on the FG from an insulation film of a different material from the interlayer insulation film and subjected to CMP.

The initial steps of the fifth embodiment are similar to the steps shown in FIGS. 1–4 regarding the first embodiment. After the formation of the structure of FIG. 4, a sidewall spacer 24 is formed from an insulation film of a material different from the interlayer insulation film 8 on the side walls of floating gate lower layer 4 of a polycrystalline silicon film and hard mask 5 of silicon nitride film thereon as shown in FIG. 21. Interlayer insulation film 8 is subsequently formed, etched back and planaiized by CMP until the silicon nitride film is exposed as shown in FIG. 21.

Figure 22:
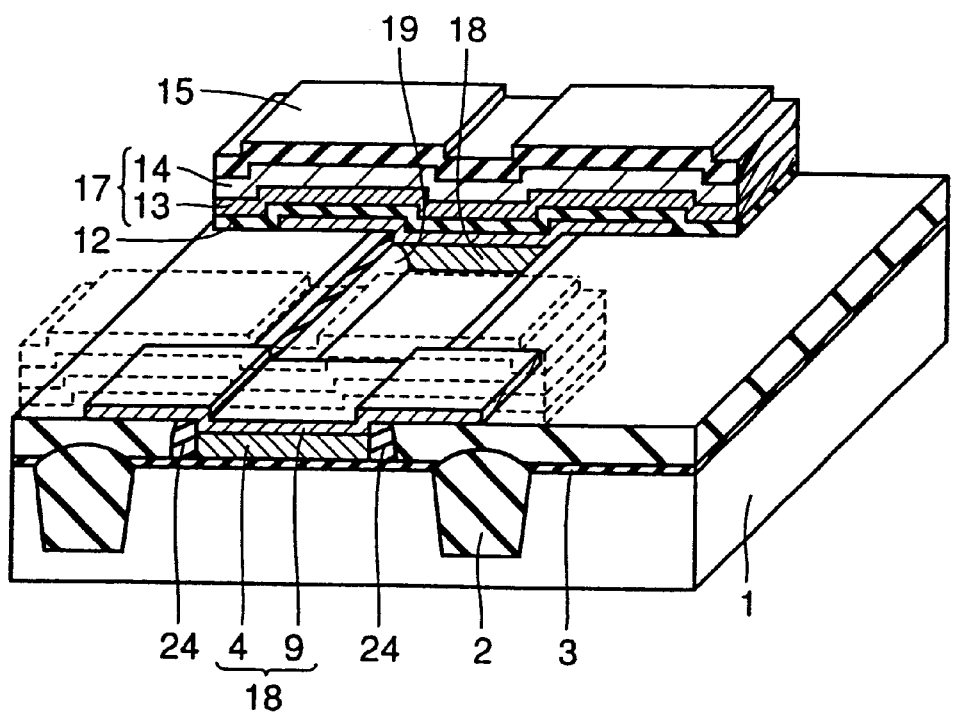
FIG. 22 is a perspective view of a structure where the FG is etched.
Figure 23:
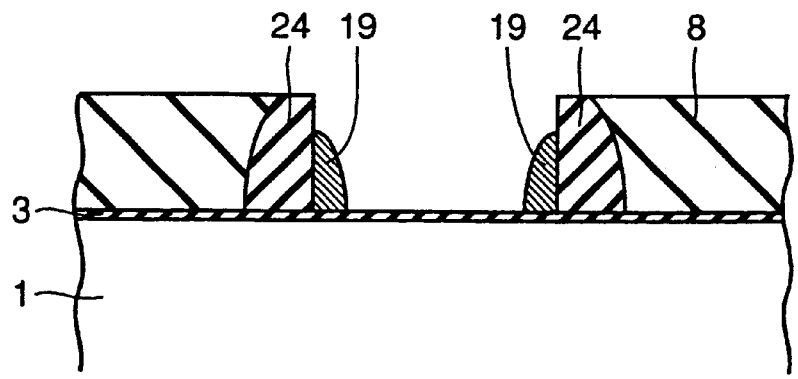
FIG. 23 is a sectional view by a vertical plane including X–X' of FIG. 22.
Figure 24:
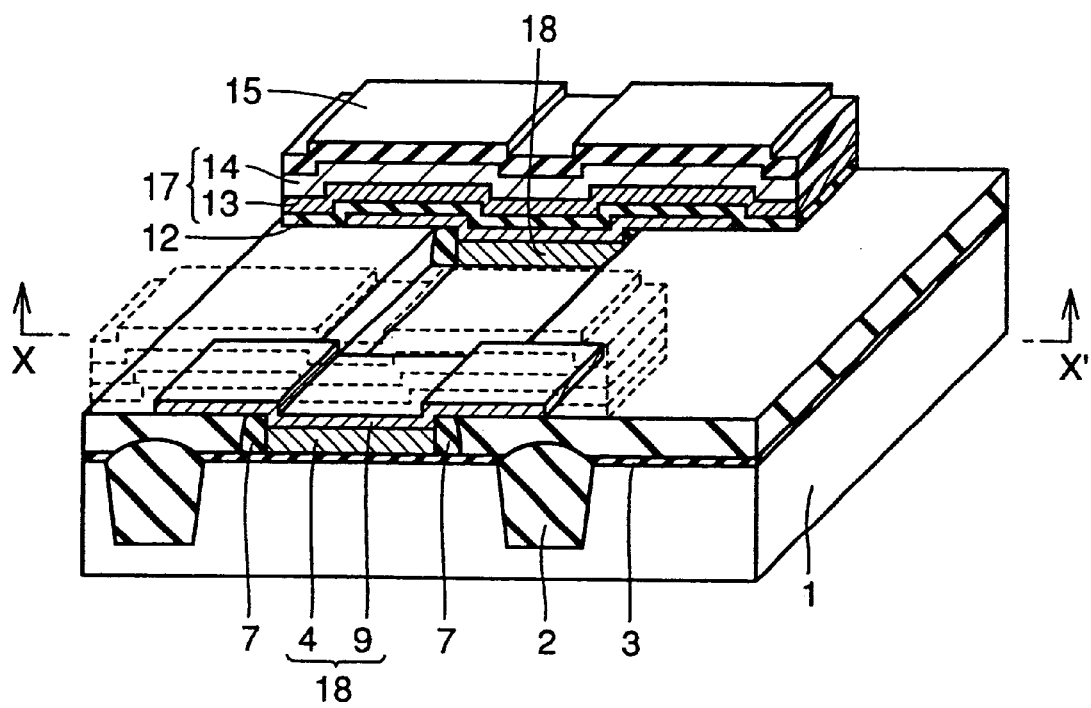
FIG. 24 is a perspective view of a structure where the sidewall spacer has been removed and the etching residue has been lift off.
Figure 25:
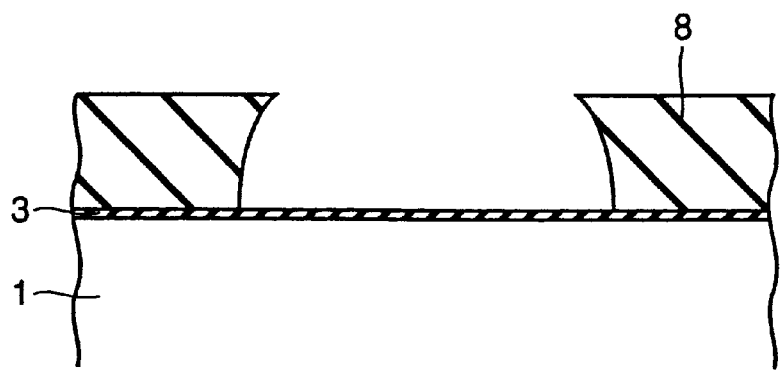
FIG. 25 is a sectional view by a vertical plane including X–X' of FIG. 24.

The steps after the formation of the structure shown in FIG. 21 are the same with the steps shown in FIGS. 6–12. After the formation of the structure shown in FIG. 12 where the materials of the sidewall spacer and interlayer insulation film 8 are different, floating gate electrode 18 is formed by anisotropic etching using control gate electrode 17 as a mask. Here, a polycrystalline silicon residue remains. FIG. 23 shows a section by the vertical plane including the line X–X' shown in FIG. 22. Etching residue is left such that it adheres to the wall surface of sidewall spacer 24. If sidewall spacer 24 is a silicon nitride film and interlayer insulation film 8 is a TEOS oxide film, sidewall spacer 24 alone can be selectively removed through hot phosphoric acid treatment leaving interlayer insulation film 8 and first gate insulation film 3 almost unetched. The etching residue is also lift off and removed at the removal of sidewall spacer as shown in FIGS. 24 and 25. FIG. 25 is a sectional view of the central trench portion by a vertical plane including the line X–X' shown in FIG. 24.

As can be seen from the foregoing, by the lift-off and removal of the polycrystalline silicon residue between gate electrodes after the formation of the sidewall spacer formed of an insulation film of a material different from the interlayer insulation film on the side wall of the floating gate electrode, short-circuit can be prevented without damages on first gate insulation film 3 and interlayer insulation film 8. As a result, the yield of the non-volatile semiconductor memory device can be improved significantly.

Sixth Embodiment

Figure 26:
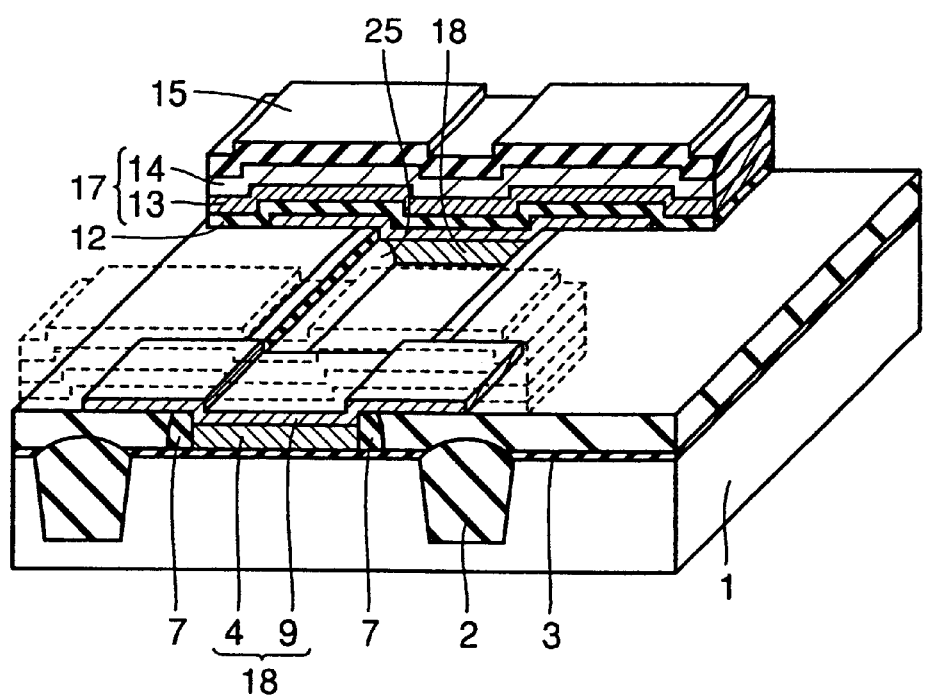

The initial steps of the sixth embodiment are the same with the steps of the first embodiment shown in FIGS. 1–12. When the floating gate electrode is formed using the control gate electrode as a mask after the completion of the structure shown in FIG. 12, a polycrystalline silicon residue is produced along the side surface of the central trench portion. Polycrystalline etching residue is turned into an insulation, such as silicon oxide by subsequent thermal oxidation for 10–30 minutes at 850–1050° C., or silicon nitride by nitriding. Then a polycrystalline silicon residue 25 turned into an insulation through thermal oxidation or nitriding is left on the side surface of the interlayer insulation film as shown in FIG. 26.

By turning the polycrystalline silicon residue into an insulation through thermal oxidation or the like as described above, short-circuit between gate electrodes can be prevented without damages on first gate insulation film 3 and interlayer insulation film 8, whereby the yield improvement of non-volatile semiconductor memory device is allowed.

Seventh Embodiment

Figure 27:
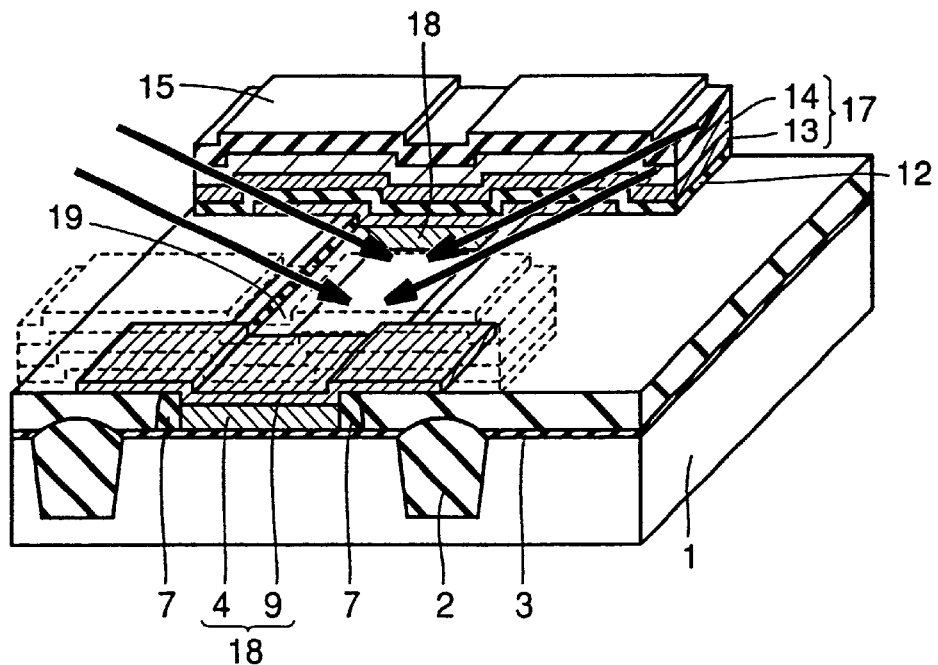
FIG. 27 is a perspective view of a structure where oxygen or the like is implanted to the etching residue.
Figure 28:
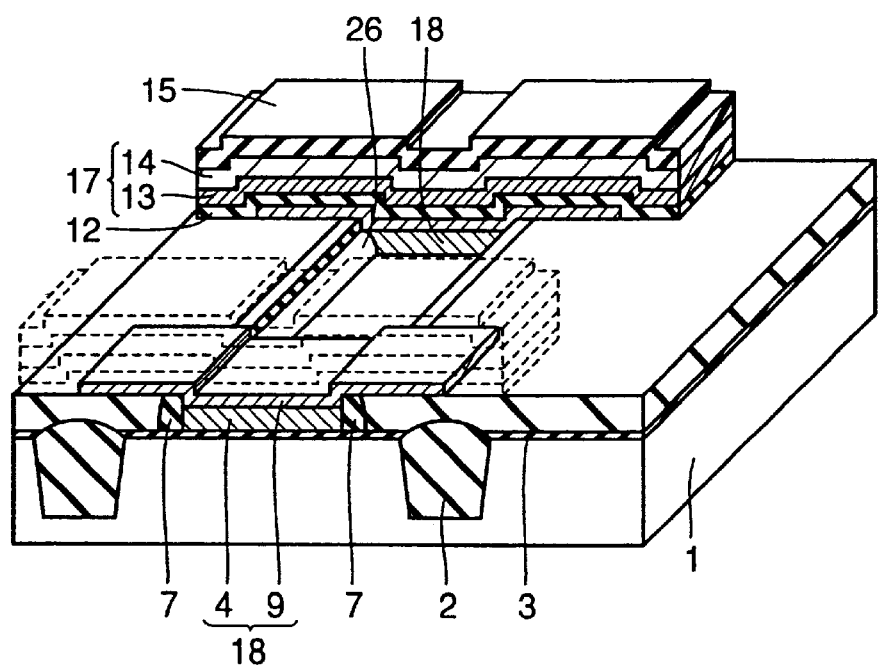
FIG. 28 is a perspective view showing the etching residue to which oxygen or the like has been ion implanted.

The initial steps of the seventh embodiment are the same with the steps of the first embodiment shown in FIGS. 1–12. When the floating gate electrode is subsequently formed using the control gate electrode as a mask, polycrystalline silicon residue 19 is produced along the side surface of the insulation film facing the central trench portion. Etching residue 19 is turned into an insulation such as oxide, nitride or the like, through ion implantation of oxygen, nitrogen or the like at an oblique angle into etching residue 19 as shown in FIG. 27. In FIG. 27, an arrow indicates a direction of the oblique ion implantation. As a result, an etching residue 26 turned into an insulation by ion implantation remains on the side surface of interlayer insulation film 8 facing the trench portion.

By turning the polycrystalline silicon residue into an insulation by ion implantation of oxygen or nitrogen as described above, short-circuit between gate electrodes can be prevented without damages on first gate insulation film 3 and interlayer insulation film 8, whereby the yield improvement of non-volatile semiconductor memory device is allowed.

Eighth Embodiment

The eighth embodiment is effective when damages which can be caused especially on the control gate electrode in fifth, sixth and seventh are concerned. The initial steps of eighth embodiment are the same with the steps of the first embodiment shown in FIGS. 1–12. In the drawing corresponding to the fifth embodiment, however, the materials of sidewall spacer and interlayer insulation film 8 are different from each other.

Figure 29:
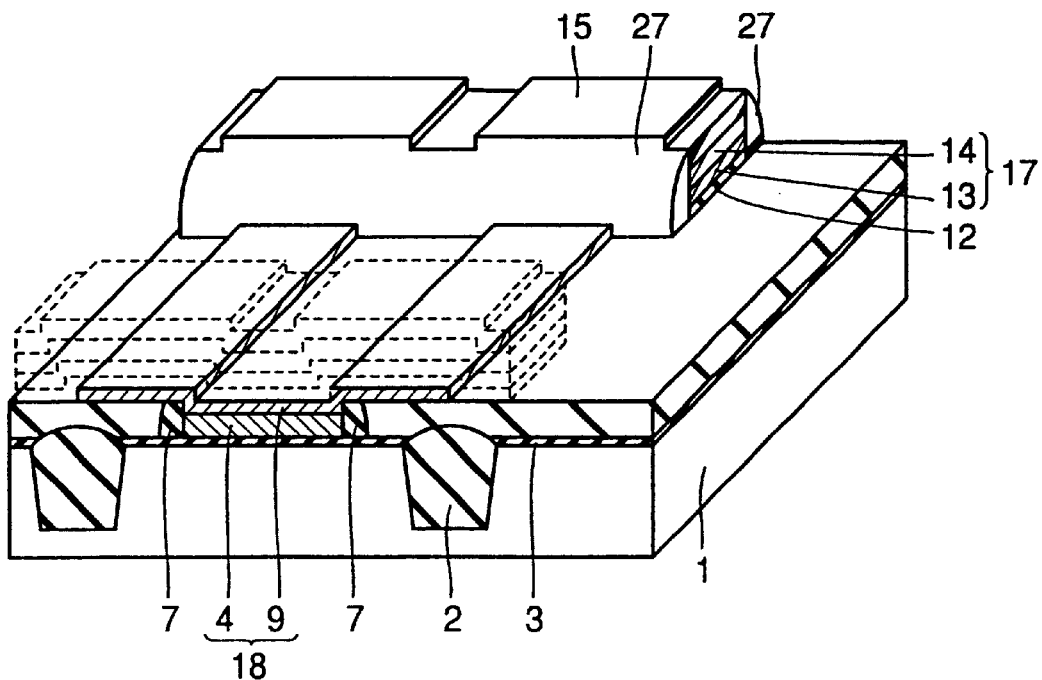
FIG. 29 is a perspective view of a structure where a sidewall is formed along the longitudinal direction of the CG.
Figure 30:
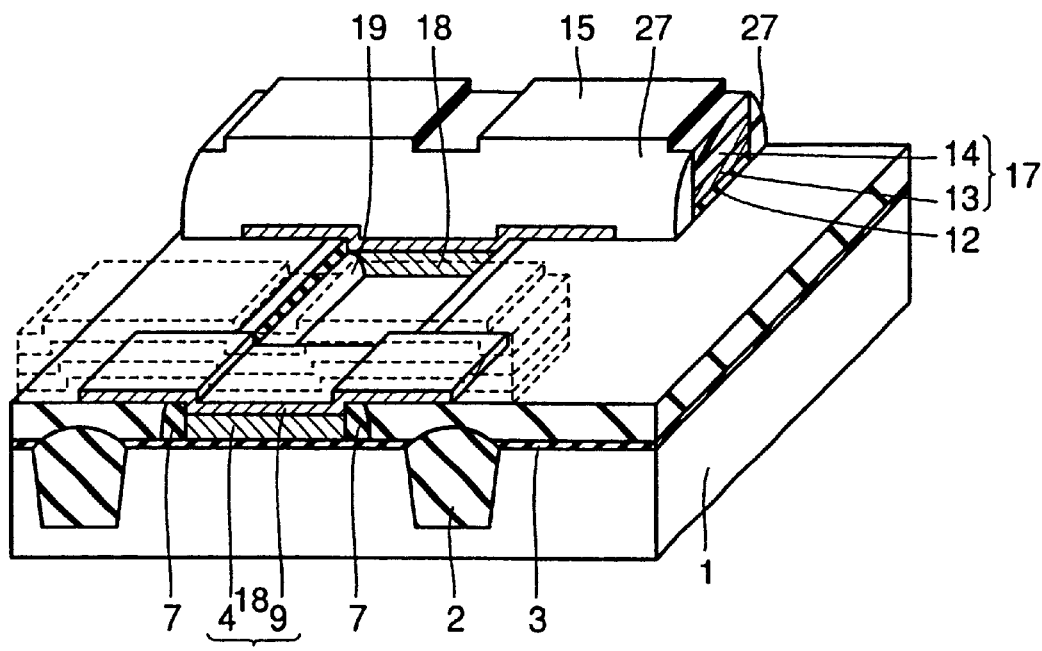
FIG. 30 is a perspective view of a structure where a part of the FG has been etched away from the structure shown in FIG. 29.
Figure 31:
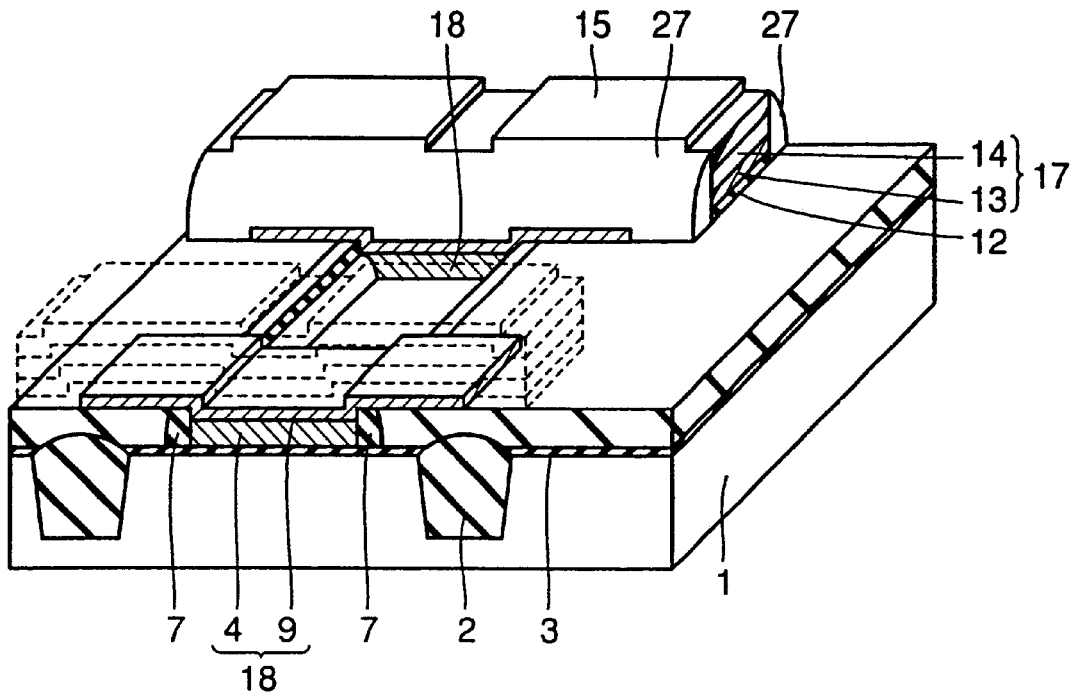

Sidewalls 27 are formed of an insulation film on side walls of control gate electrode 17 as shown in FIG. 29 after the formation of the structure shown in FIG. 12. Then by removing the lower layer of floating gate layer by etching, using control gate 17 and sidewall 27 as masks, floating gate electrode 18 is formed. Through the etching, a gate electrode having control gate electrode 17 as an upper layer and floating gate electrode 18 as a lower layer is formed as shown in FIG. 30. In FIG. 30, a sidewall is also formed in the portion not shown.

Through the etching, a polycrystalline silicon residue, which is an etching residue, is produced along the side wall facing the central trench portion. In fifth, sixth and seventh embodiments, lift-off by hot phosphoric acid treatment or the like, insulation formation by thermal oxidation or the like and insulation formation by ion implantation are performed, respectively. Sidewall 27 described above serves as a protective film for the control gate electrode during these processes.

As a result, damages on control gate electrode 17 as well as first gate insulation film 3 and interlayer insulation film 8, and short circuit between gate electrodes can be prevented thereby allowing the yield improvement of non-volatile semiconductor memory devices.

Ninth Embodiment

Figure 32:
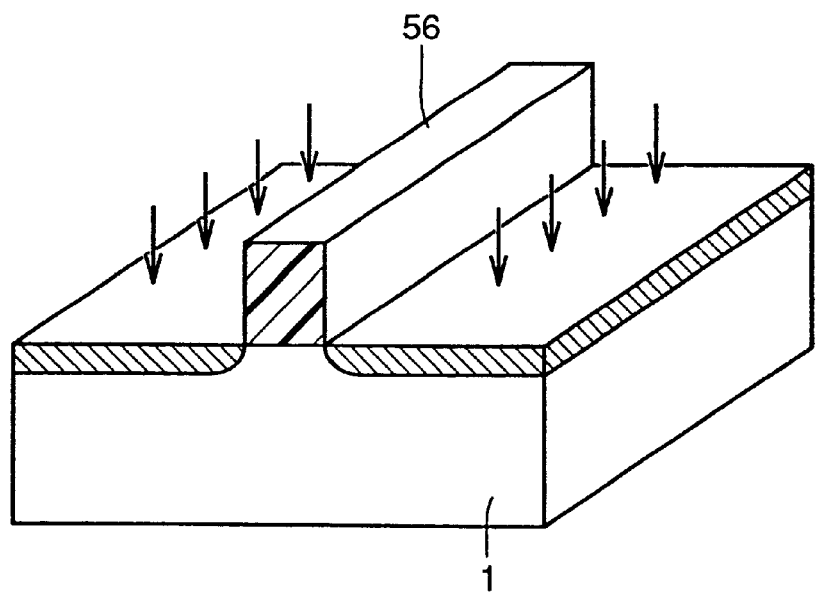
FIG. 32 is a perspective view during the implantation of an impurity using a resist as a mask.
Figure 33:
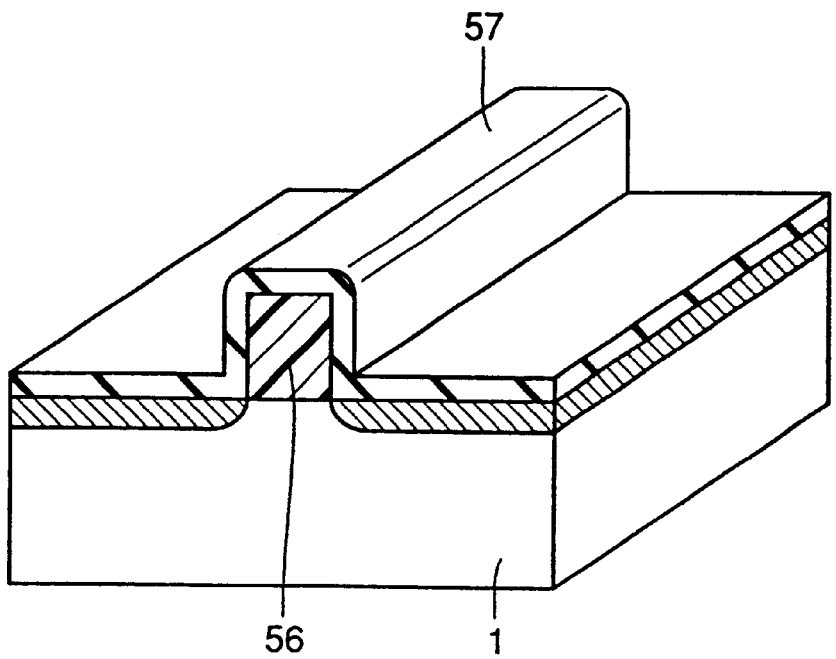
FIG. 33 is a perspective view of a structure covered by an overcoat.
Figure 34:
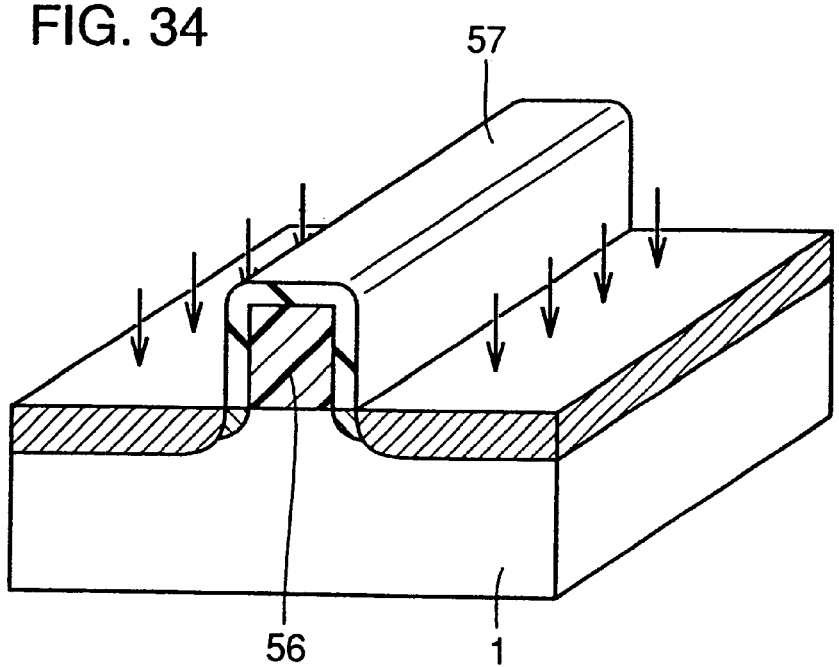
FIG. 34 is a perspective view during the formation of an LDD (Lightly-Doped-Drain) using the overcoat as a mask.

After the formation of the isolating insulation film in the semiconductor substrate through LOCOS, trench isolation or the like, a photo resist 56 is formed in a section where gate interconnection is to be formed as shown in FIG. 32. Then, an active region is formed on the silicon substrate through ion implantation with the use of the photo resist as a mask. Then as shown in FIG. 33, an over coat film 57 is formed on the structure shown in FIG. 32 and is etched back by development or the anisotropic etching. Then, an LDD (Lightly-Doped-Drain) layer is formed while securing the side space as shown in FIG. 34.

Figure 35:
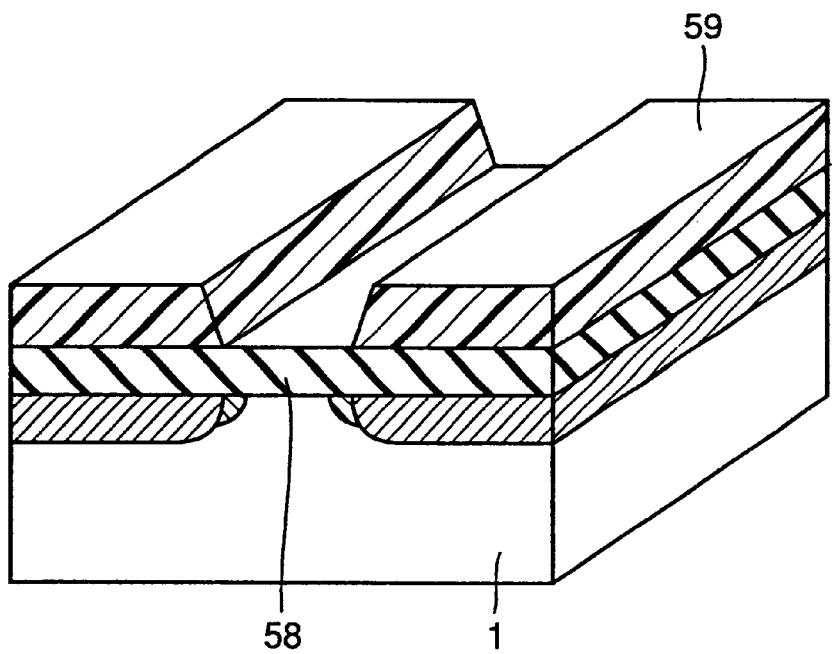
FIG. 35 is a perspective view of a structure where an interlayer insulation film is formed and the LDD region is covered by a photo resist.

After the removal of over coat film 57 and photo resist 56, a silicon oxide film which is to be an interlayer insulation film 58 is deposited and a photo resist 59 having a trench in a section which is to be a gate interconnection portion is formed as shown in FIG. 35. Silicon oxide film 58 described above is etched by using photo resist 59 as a mask.

An angle formed by each of the opposing side walls of the trench formed by the etching and the base plane of the interlayer insulation film 58 is preferably at least 85° and less than 90° in a section perpendicular to the extension of the side wall. As a result, the trench has preferably a tapered shape having a wider opening towards the top. In other word, both walls of the trench desirably run such that the trench get wider towards the top.

In order to satisfy this condition, preferably, concentration of gas with a high etching selectivity to silicon such as $CHF_3$, $C_4F_8$ or the like is high and RF bias voltage of the etching system is low.

Figure 36:
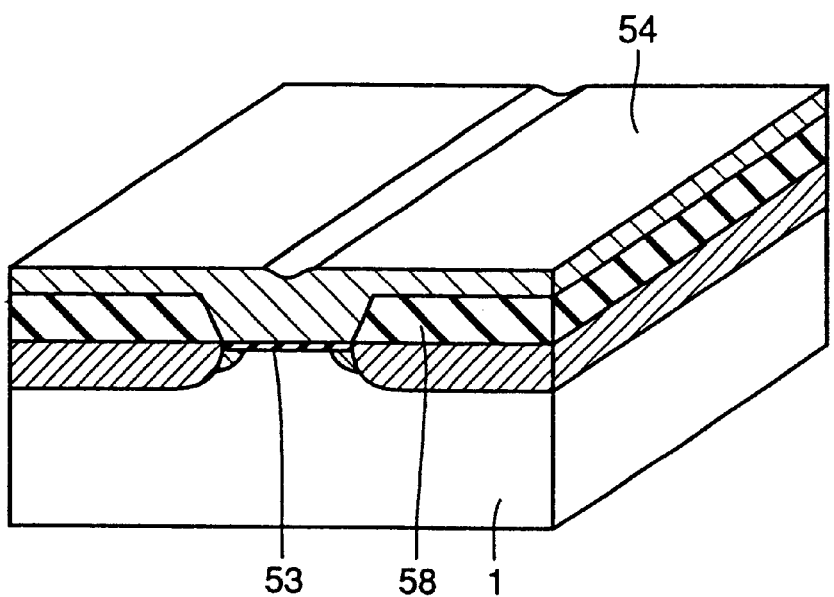
FIG. 36 is a perspective view of a structure where a polycrystalline silicon film is formed.
Figure 37:
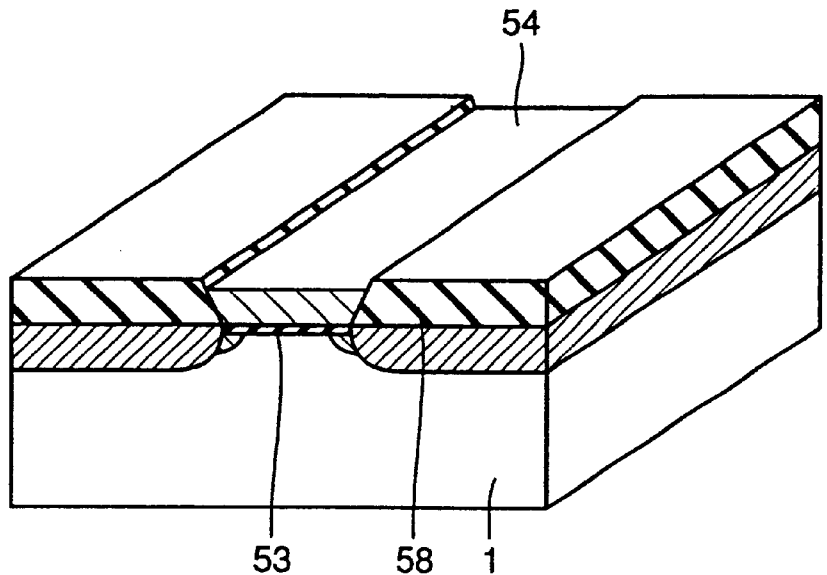
FIG. 37 is a perspective view of a structure where a FG lower layer is formed.

Then after the formation of a first gate oxide film 53 on a bottom surface of the trench, a polycrystalline silicon layer or an amorphous silicon film 54 is deposited as shown in FIG. 36, and is left only in the trench portion as shown in FIG. 37 through etch back or CMP. Then, a polycrystalline silicon layer or an amorphous silicon layer which is to be a fin layer of the floating gate electrode is formed on the above described polycrystalline silicon layer or the amorphous silicon layer. After the formation of a photo resist thereon, the layer is etched to complete the formation of the fin portion and thus the floating layer.

Figure 38:
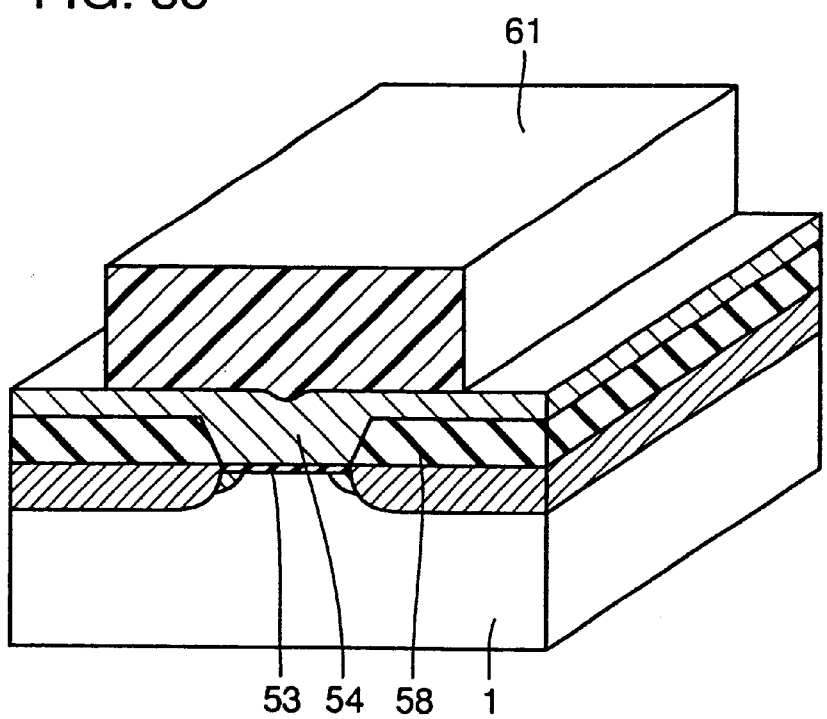
FIG. 38 is a perspective view of a structure where a resist is formed on the polycrystalline silicon film entirely etched back.
Figure 39:
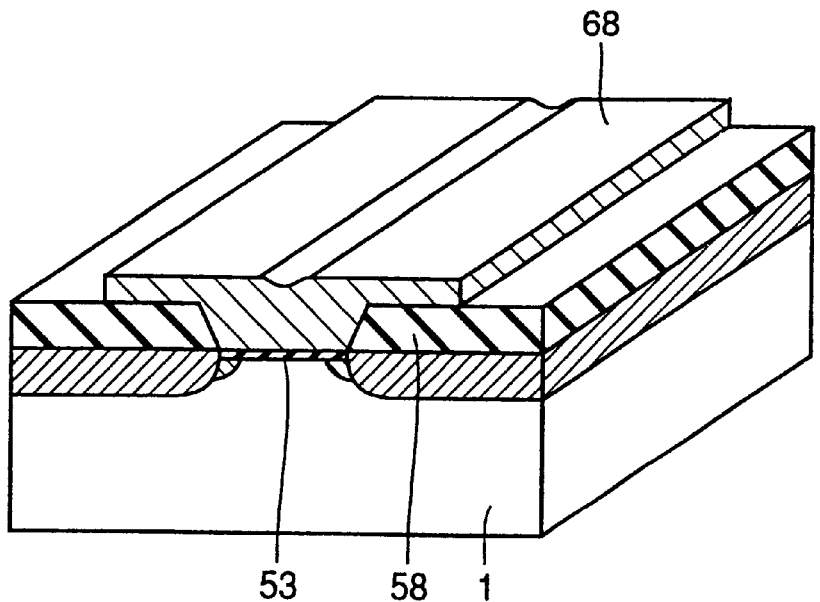
FIG. 39 is a perspective view of a structure where a FG with a fin layer is formed.

As a further method to complete the structure of the floating gate fin layer from the structure shown in FIG. 36, the following method is applicable. As shown in FIG. 36, after the formation of the polycrystalline silicon layer or the amorphous silicon film, an entire surface is etched back and then a photo resist 61 covering only the floating gate fin electrode is formed as shown in FIG. 38. Subsequent anisotropic etching allows simultaneous formations of the floating gate layer and the fin layer as shown in FIG. 39.

Figure 40:
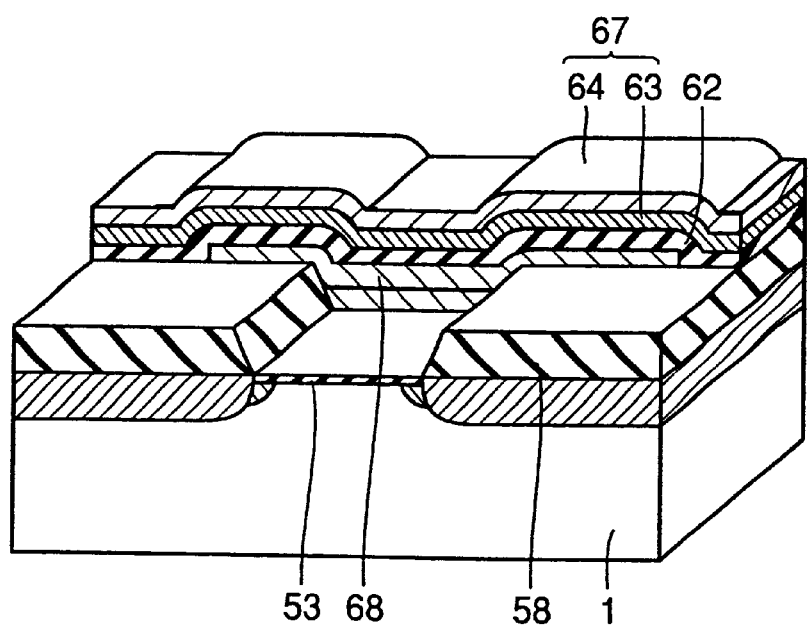
FIG. 40 is a perspective view of a structure where a trench portion is formed by etching the FG using the CG as a mask with no residence remained.

After the formation of the floating gate fin layer, an ONO film 62, a polycrystalline silicon 63, a tungsten silicide film 64 and a silicon oxide film are formed. After the etching of tungsten silicide film 64, the polycrystalline silicon or amorphous silicon film, and the ONO film using the silicon oxide film as a mask, the uppermost silicon oxide film is removed. Then the floating gate layer is etched through anisotropic etching by using a control gate electrode 67 as a mask, and a floating gate electrode 68 is formed as shown in FIG. 40.

In this anisotropic etching, due to the tapered shape of the trench side walls formed of an oxide layer, the opening of the trench is wider towards the top, and etching is not partially blocked, whereby etching residue of polycrystalline silicon or amorphous silicon is prevented from being left on the side walls.

Tenth Embodiment

In the tenth embodiment, both side walls of the trench surrounded by the insulation layer is tapered to widen the opening of the trench upwards as in the ninth embodiment described above, however, the tenth embodiment is different from the ninth embodiment in the following point: that a silicon nitride film is used as a mask instead of the photo resist to secure the gate width at an implantation of impurity into an active region of the main surface of the Semiconductor substrate.

Figure 41:
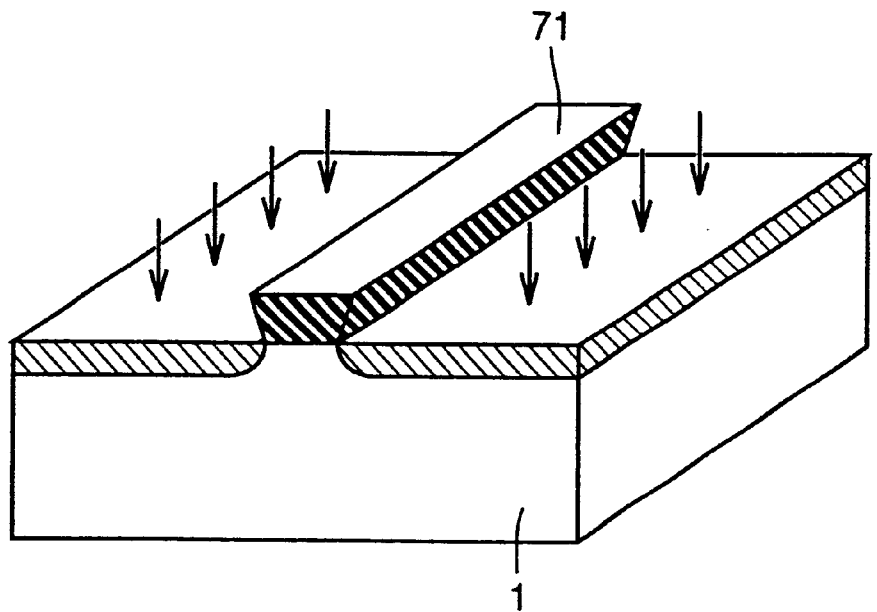
FIG. 41 is a perspective view during implantation of an impurity using a tapered nitride film having the top wider than the bottom as a mask.

In the tenth embodiment, first, the isolating insulation film is formed in the main surface of the semiconductor substrate. Then after the deposition of a silicon nitride film 71, a photo resist having a trench in the gate interconnection portion is formed thereon and the silicon nitride film is dry etched using the photo resist as a mask as shown in FIG. 41. In this etching preferably the gas containing $NF_3$ gas is employed. Through the etching with the $NF_3$ gas containing gas, opposing side walls of the above described silicon nitride film can be tapered to widen the width of the silicon nitride film upwards in the section perpendicular to the extension of the side walls of the silicon nitride film and the angle formed by each of side surfaces and the horizontal plane of active region can be made 85°–90°.

Figure 42:
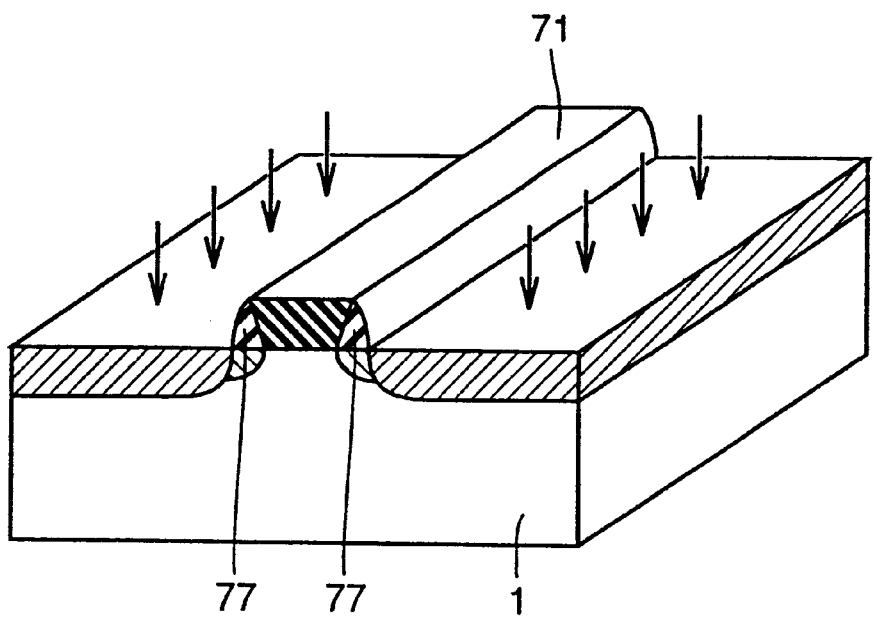
FIG. 42 is a perspective view during the formation of the LDD using a sidewall spacer as a mask.

Then by the ion implantation of impurity into the main surface of the semiconductor substrate using the silicon nitride film tapered to be wider towards the top as a mask, an active region is formed as shown in FIG. 41. Then a silicon insulation film is deposited and etched back to form a sidewall spacer 77 of the gate electrode portion. And an LDD structure is formed by implanting impurity at a high concentration using the sidewall spacer as a mask as shown in FIG. 42.

Figure 43:
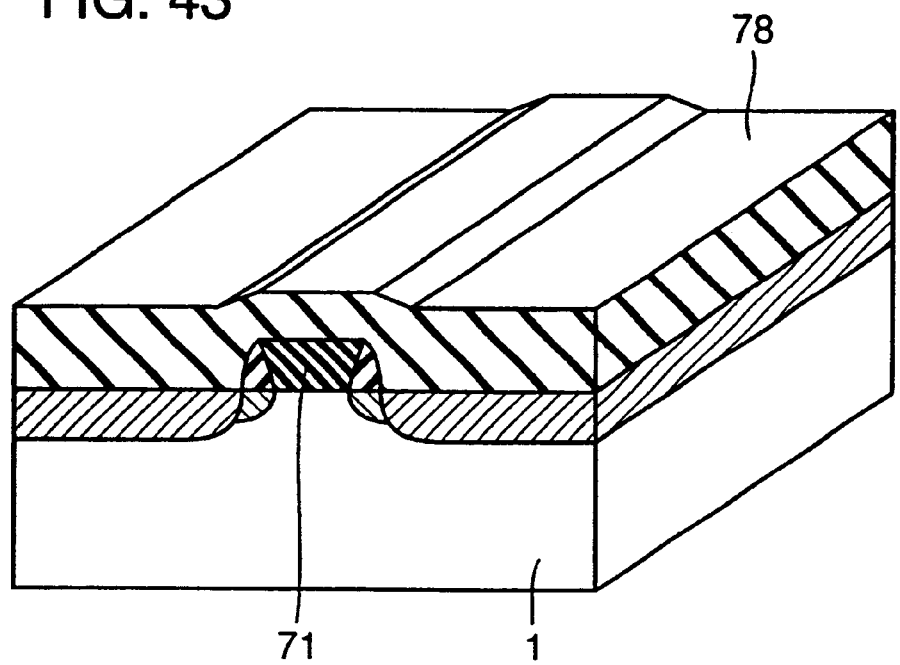
FIG. 43 is a perspective view of a structure where a silicon oxide film which is to be an interlayer insulation film is formed.
Figure 44:
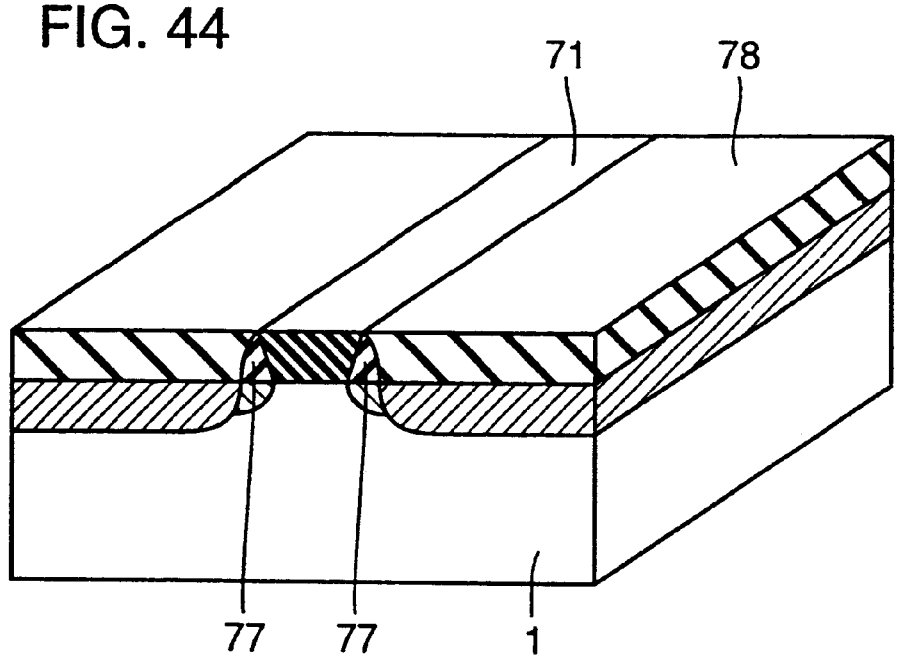
FIG. 44 is a perspective view of a structure where the silicon oxide film is planarized.
Figure 45:
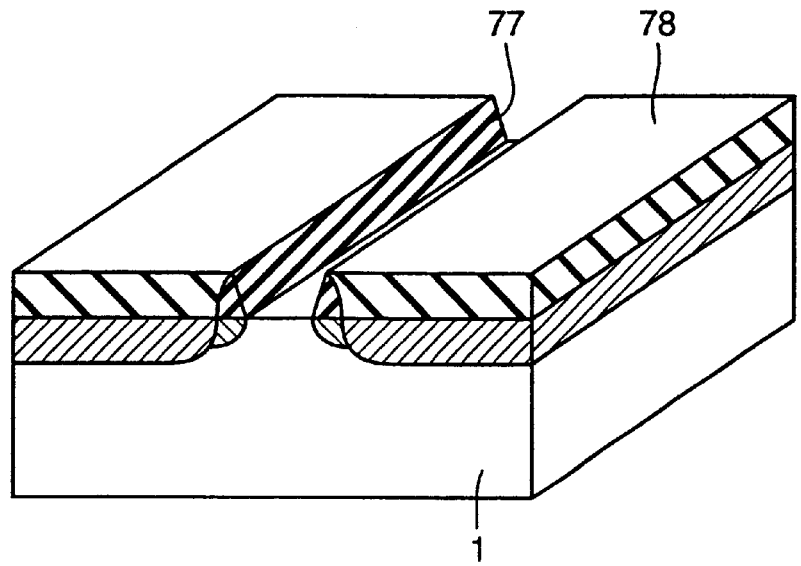
FIG. 45 is a perspective view of a structure where the silicon nitride film is removed and a trench portion is formed with side surfaces upwardly tapered to have a wider opening at the top than at the bottom.

Then as shown in FIG. 43, a silicon oxide film 78 is formed and planalized by CMP to expose the silicon nitride film on a surface as shown in FIG. 44. Through the subsequent etching and removal of the silicon nitride film with hot phosphoric acid, a trench shown in FIG. 45 is formed. As the trench is formed by removing the silicon nitride film wider towards the top as described above, the trench has opposing side surfaces similarly tapered upwards in section. Therefore, similar to the ninth embodiment described above, at the anisotropic etching of the floating gate, no portion is blocked from etching, whereby the etching residue is prevented from being left on the side wall of the trench.

Eleventh Embodiment

The eleventh embodiment is the manufacturing method which is effective when it is important to secure the high coupling capacitance ratio between the control gate and the floating gate along with the realization of miniaturization of non-volatile semiconductor memory device. In the eleventh embodiment, the coupling capacitance is increased by addition of vertical capacitance in a capacitance coupling section of the floating gate electrode and the control gate electrode, and the higher integration of the non-volatile semiconductor memory device can be achieved.

Figure 46:
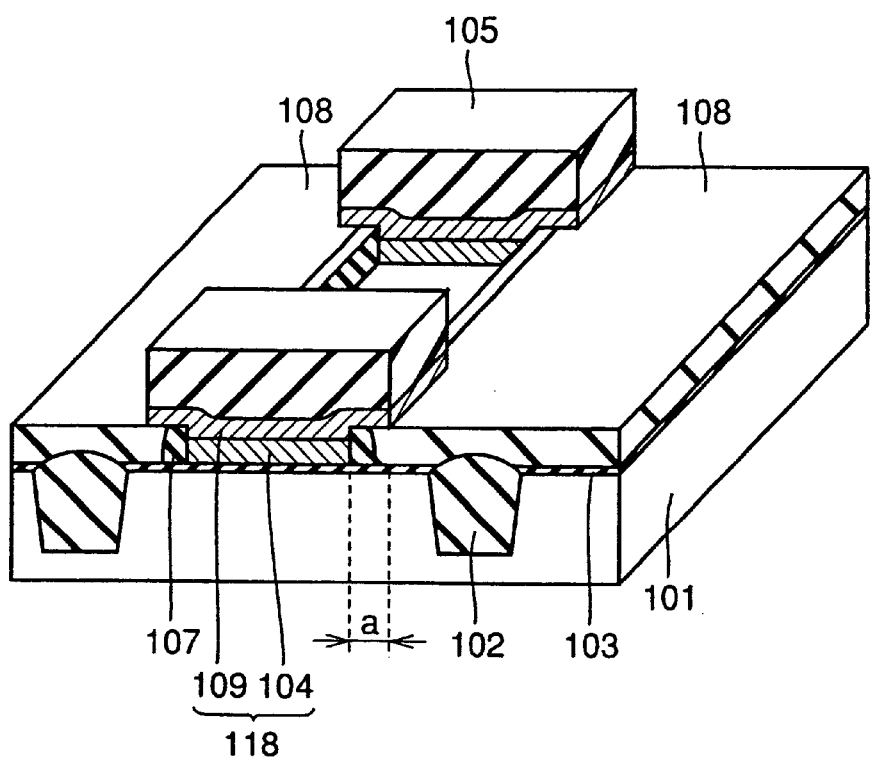
FIG. 46 is a perspective view of a structure with a short fin portion of the FG according to the eleventh embodiment.

After the formation of a floating gate lower layer 104, a floating gate fin layer 109 and a hard mask 105 of SiN film are formed by CVD and the SiN film is etched with plasma containing $CF_4$ using a resist defining the width of a floating gate layer 118 as a mask. Then, floating gate electrode 118 is formed by etching the floating gate layer with $Cl_2$ and $O_2$ containing plasma using the SiN film as a mask. FIG. 46 shows a structure after the plasma etching.

In FIG. 46, the length of an portion a is made as short as possible within the limitation of an alignment accuracy of lithography at the etching of SiN film, regardless of the coupling capacitance of the floating gate electrode and the control gate electrode. The dimension of the portion a will be described later.

Then a second interlayer insulation film 120 is formed on first interlayer insulation film 108 as a TEOS oxide film through CVD or as an SOG (Spin-On Glass) oxide film by a spin-coater. As in the formation of the floating gate electrode in the first embodiment, SiN film 105 is exposed by CMP and removed by $H_3PO_4$ at about 160° C.

Figure 47:
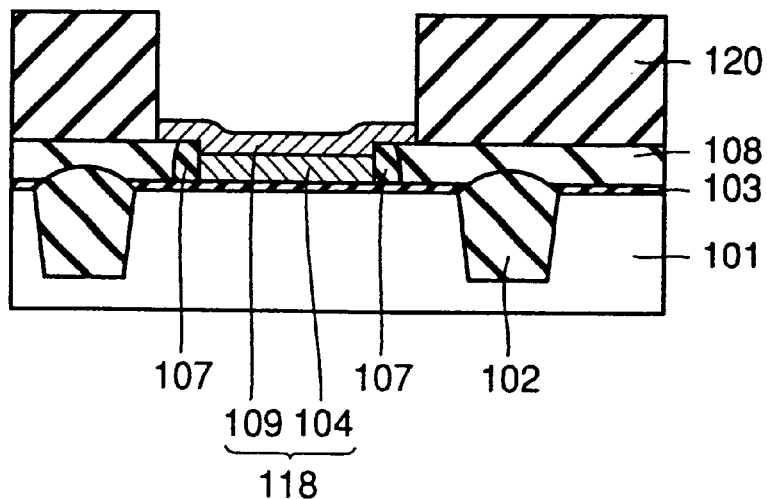
FIG. 47 is a sectional view by a plane perpendicular to a bit line in a structure with a fin layer of the FG.

FIG. 47 is a sectional view by a plane perpendicular to the bit line, showing the structure where the SiN film on floating gate electrode 118 is removed. A polycrystalline silicon film is subsequently deposited in the periphery of the first interlayer insulation film and the side wall of the second interlayer insulation film. Then by the etch back with plasma of $Cl_2$ or $Cl_2$ and He, a floating gate sidewall 121 is formed. In the above described method, interconnection in the vertical direction is formed in a self-aligned manner.

Figure 48:
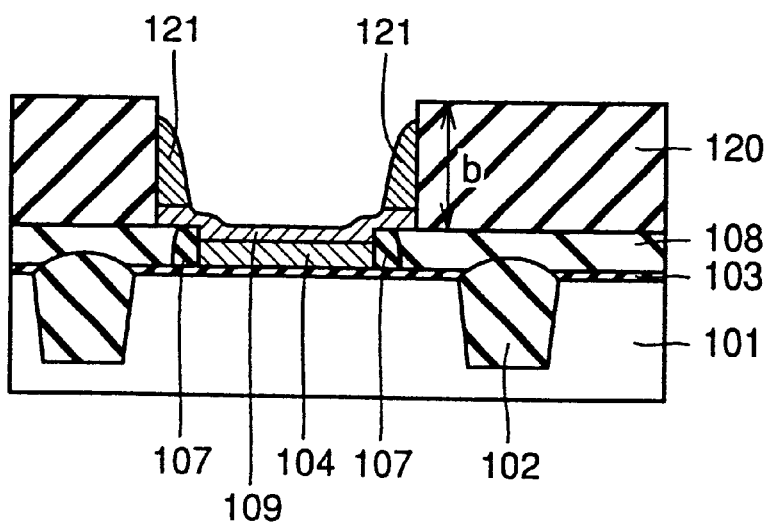
FIG. 48 is a sectional view of a structure where a vertical portion of the FG is formed.
Figure 49:
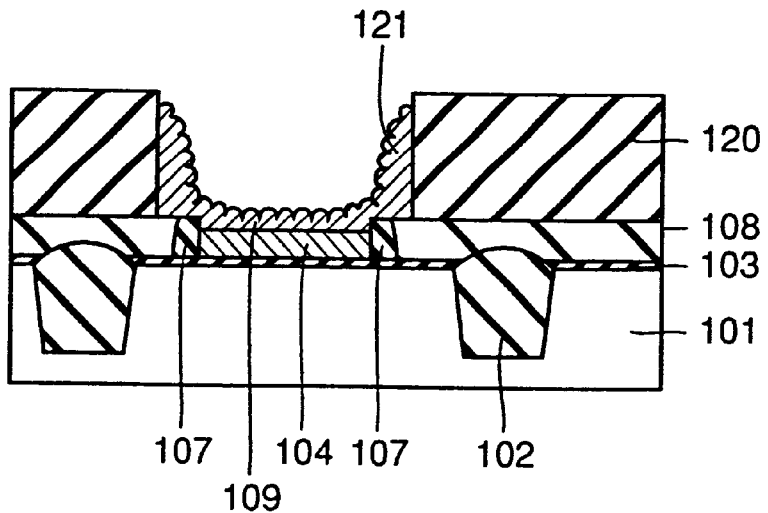
FIG. 49 is a sectional view of a structure where a surface of the FG with the vertical portion is roughened.

FIG. 48 shows a section by the plane perpendicular to the bit line where floating gate sidewall 121 is formed on the side surface of second interlayer insulation film 120 facing the trench portion. A surface of floating gate fin electrode 109 and floating gate sidewall 121 which is a portion thereof in the trench portion may and preferably be roughened as shown in FIG. 49, to increase the area in contact with the second gate insulation film thereby increasing capacitance C2. Here, instead of the polycrystalline silicon, an amorphous silicon film may be deposited and etched back to form the floating gate fin electrode 109 and floating gate sidewall 121. In addition, similar to the polycrystalline silicon, amorphous silicon floating gate fin electrode 109 and floating gate sidewall 121 which is a portion thereof may and preferably be crystallized and roughened in the surface section in contact with the second gate insulation film as shown in FIG. 49 to increase capacitance C2.

The length of the portion a shown in FIG. 46 can be made to the shortest length within the accuracy limitation of lithography through the above described capacitance increase. As a result, the length can be decreased from about 0.25 $\mu$m in the conventional case to 0.05 $\mu$m. By the significant decrease in the dimension of the portion a, a significant miniaturization of the non-volatile semiconductor memory device can be achieved.

Figure 50:
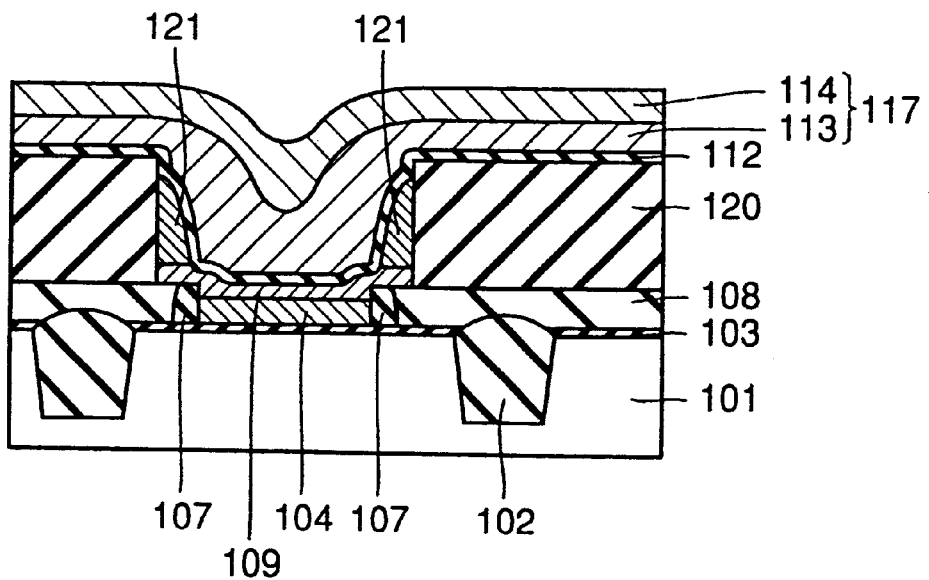
FIG. 50 is a sectional view of a gate electrode portion with the vertical portion.

The length of a portion b shown in FIG. 48 is defined by the coupling capacitance between the control gate electrode and the floating gate electrode and can be reduced due to the surface roughening described above. As a result, the formation of the interlayer insulation film is facilitated. An ONO film is then deposited as a second gate insulation film 112 and further a control gate lower electrode 113 of polycrystalline silicon and a control gate upper electrode 114 of a tungsten silicide film are deposited and a control gate electrode 117 is formed as shown in FIG. 50.

In a non-volatile semiconductor memory device having a first gate fin electrode sidewall 121 extending along the side wall of the second interlayer insulation film 120 shown in accordance with the eleventh embodiment, for preventing the etching residue from being produced on two steps ( two steps having side walls of insulation films in contact with the first gate lower electrode 104 and the second interlayer insulation film 120) shown in each of FIGS. 47–50, the side walls of the two steps are tapered to prevent the formation of a portion blocked from etching. This is a desirable configuration in the miniaturized non-volatile semiconductor memory device for preventing short-circuit between gate electrodes.

Similarly, in a non-volatile semiconductor memory device having a first gate fin electrode sidewall 121 extending along the side wall of the second interlayer insulation film 120 shown in accordance with the eleventh embodiment, it is desirable for the prevention of short-circuit between the gate electrodes in a miniaturized non-volatile semiconductor memory device that (i) the etching residue produced on the above described step is remove by isotropic etching, (ii) a protective film is formed on the side wall of the second gate electrode by isotropic etching, or (iii) produced etching residue is turned into an insulation.

Twelfth Embodiment

Figure 51:
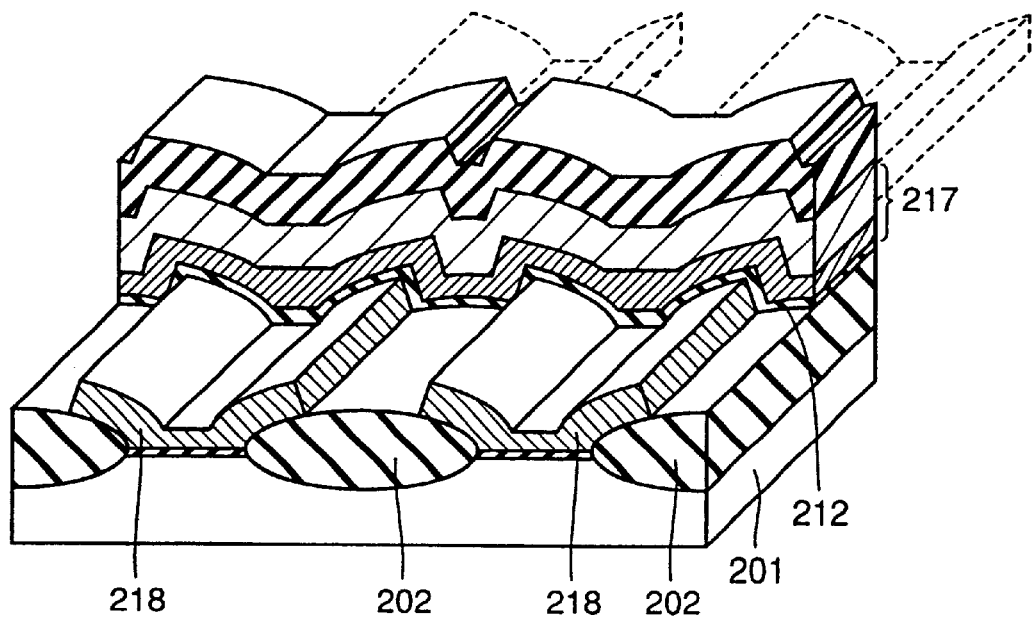
FIG. 51 is a perspective view of a structure where etching is performed to make a tapered gate region with an opening at the top wider than that at the bottom according to the twelfth embodiment.
Figure 52:
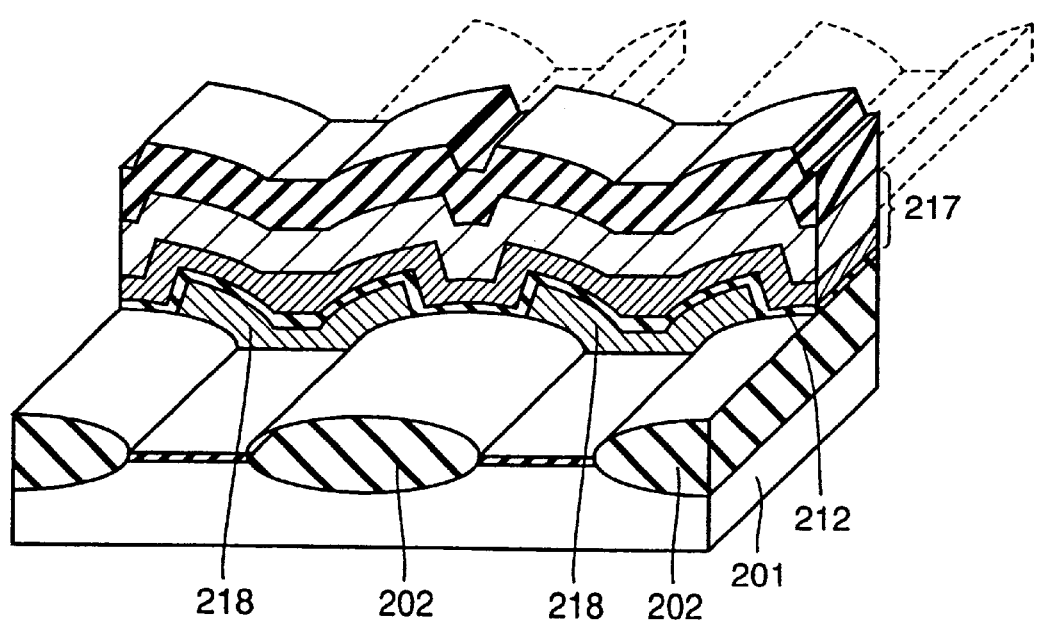
FIG. 52 is a perspective view of a structure where the trench portion is etched according to the tenth embodiment.
Figure 53:
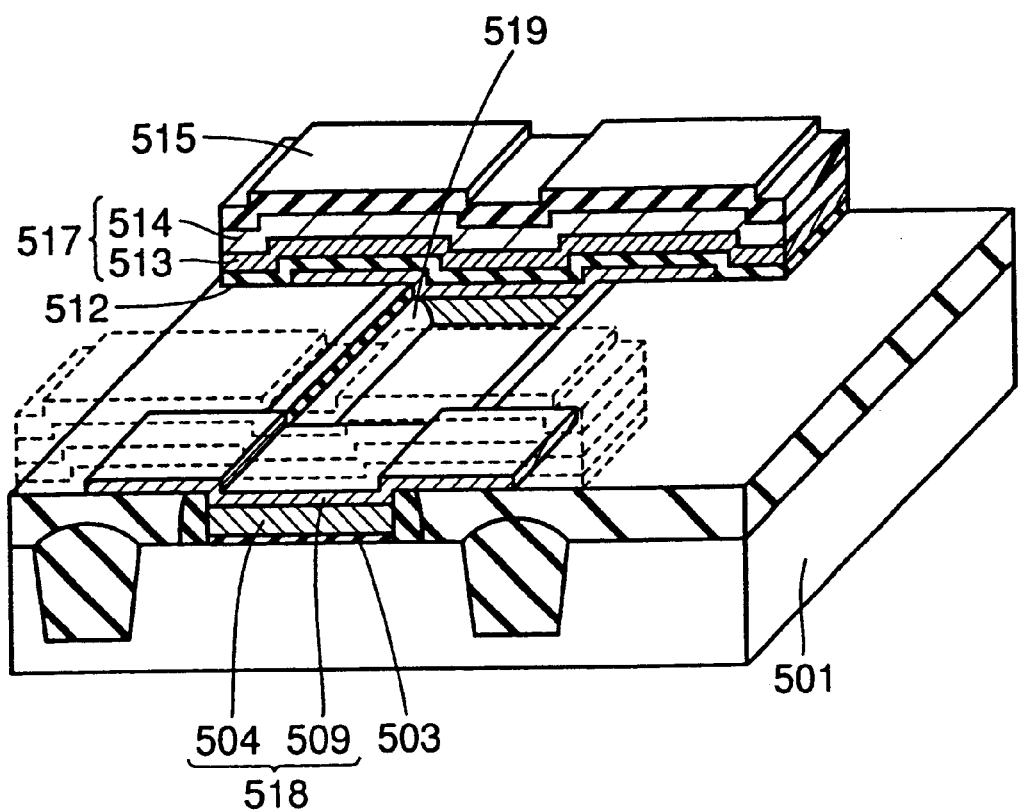
FIG. 53 is a perspective view of a structure where the etching residue remains after the etching of the FG according to a conventional method.
Figure 54:
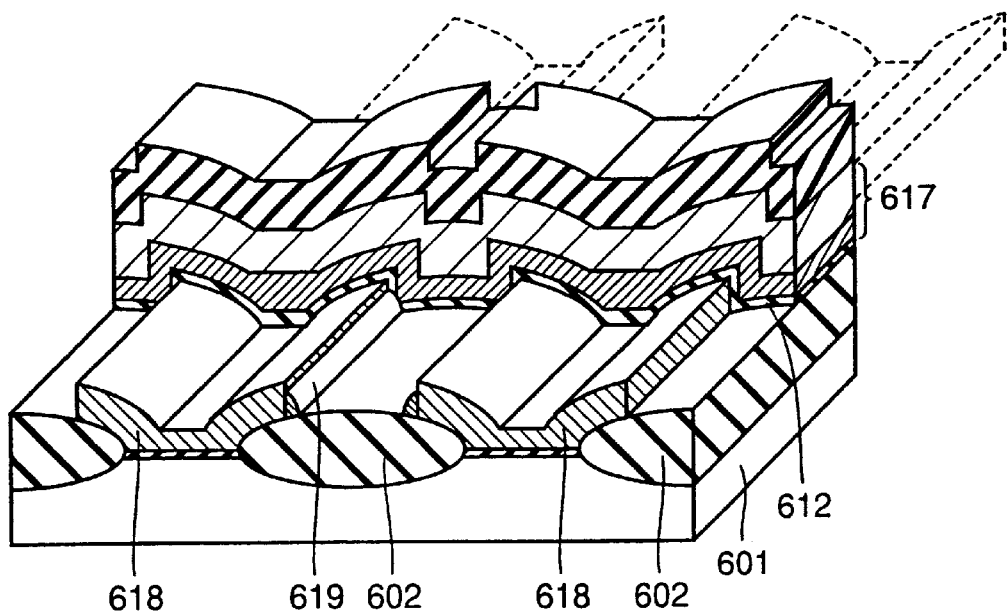
FIG. 54 is a perspective view of a structure where etching is performed to produce a vertical step in the FG according to a conventional method.
Figure 55:
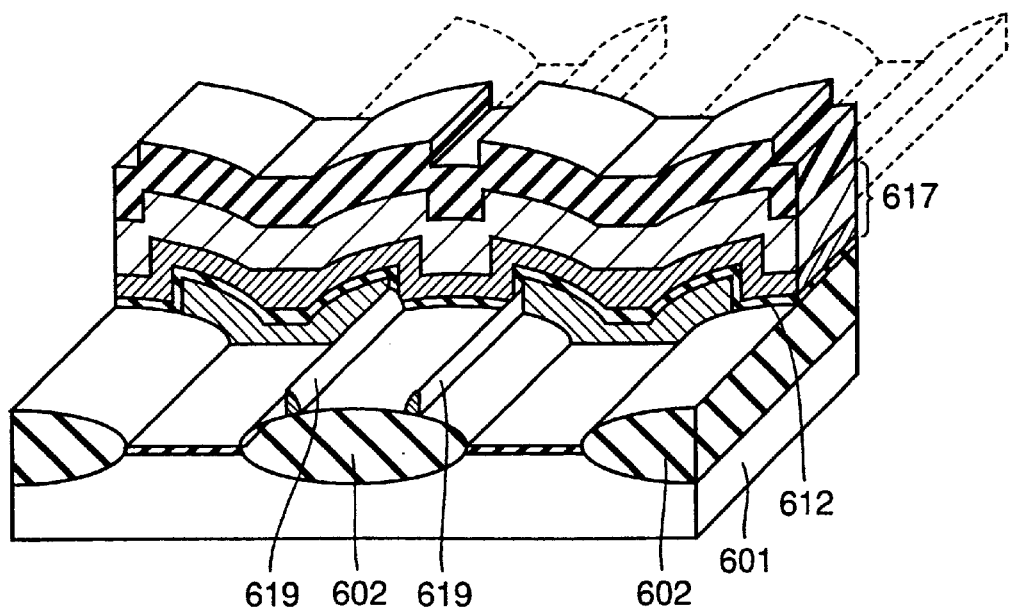
FIG. 55 is a perspective view of a structure where etching is performed on the FG according to a conventional method.

The twelfth embodiment is a manufacturing method in accordance with the present invention for preventing the formation of a polycrystalline silicon residue on a step formed by the floating gate and the isolating insulation film. Here, as shown in FIG. 51, a trench formed in a floating gate electrode 218 above the isolating insulation film is tapered such that opposing side surfaces thereof together widen the width of the trench upwards in a section perpendicular to the extension of the wall surface of the trench. As a result, as there is no portion blocked from the etching, as shown in FIG. 52, there is no side wall deposition film to which etchant will adhere, therefore no etching residue will be produced.

As for the gas employed to form floating gate electrode 218 in the above described shape, a mixed gas of $Cl_2$ and HBr, a mixed gas of HBr and $O_2$, or a mixed gas of $Cl_2$, HBr and $O_2$ is preferable.

With the tapered floating gate layer having no portion blocked from etching as described above, the etching residue can be prevented from being produced and short-circuit between gate electrodes can be prevented. In addition, as a result, a significant yield improvement of non-volatile semiconductor memory device can be achieved.

Although the present invention has been described and illustrated in detail, it is clearly understood that the same is by way of illustration and example only and is not to, be taken by way of limitation, the spirit and scope of the present invention being limited only by the terms of the appended claims.

What is claimed is:

1. A non-volatile semiconductor memory device comprising:
   a first gate insulation film formed on a main surface of a semiconductor substrate;
   a first gate electrode formed thereon;
   a second gate electrode formed on said first gate electrode with a second gate insulation film posed therebetween; and
   a protective film on a side wall of said second gate electrode but not on a sidewall of the first gate electrode.

2. A non-volatile semiconductor memory device comprising:
   a first gate lower electrode having a width, formed on a main surface of a semiconductor substrate with a first gate insulation film posed therebetween;
   a first interlayer insulation film, formed over an isolation film, thicker than the first gate lower electrode and defining the width of said first gate lower electrode;
   a second interlayer insulation film formed on said first interlayer insulation film;
   a first gate fin electrode formed on said first gate lower electrode, having a fin portion extending in the periphery of the first interlayer insulation film and along a side wall of the second interlayer insulation film, and making up a first gate electrode together with said first gate lower electrode; and
   a second gate electrode formed on said first gate fin electrode with a second gate insulation film posed therebetween.

3. The non-volatile semiconductor memory device according to claim 2, further comprising silicon compound formed by turning polycrystalline silicon into an insulation on a side wall of one of a step formed by an insulation film in contact with a side wall of said first gate lower electrode and said first gate insulation film, and a step formed by the first interlayer insulation film and the second interlayer insulation film.

4. The non-volatile semiconductor memory device according to claim 2, wherein an angle formed by the side wall of the insulation film in contact with the side wall of said first gate lower electrode and said first gate insulation film is more than 90° with respect to said first gate lower electrode in a section perpendicular to extension of said first gate lower electrode, and each of opposing side walls of the insulation film in contact with opposing side walls of said first gate lower electrode is tapered so as to widen width of said first gate lower electrode upwards.

5. The non-volatile semiconductor memory device according to claim 4, wherein an angle formed by an upper surface of said first interlayer insulation film and the side wall of said second interlayer insulation film is more than 90° with respect to the upper surface of the first interlayer insulation film in contact with said fin portion, and each of opposing side walls of said second interlayer insulation film is tapered so as to widen the widths of said first gate fin electrode and said second gate electrode upwards.

6. The non-volatile semiconductor memory device according to claim 2 wherein at least a surface of the fin portion in the first gate fin electrode is roughened.

* * * * *